United States Patent [19]

Smith

[11] Patent Number: 4,533,934

[45] Date of Patent: Aug. 6, 1985

[54] DEVICE STRUCTURES FOR HIGH DENSITY INTEGRATED CIRCUITS

[75] Inventor: Philip C. Smith, Columbia, Md.

[73] Assignee: Westinghouse Electric Corp., Pittsburgh, Pa.

[21] Appl. No.: 192,961

[22] Filed: Oct. 2, 1980

[51] Int. Cl.³ .................. H01L 27/12; H01L 29/78; G11C 11/40

[52] U.S. Cl. ................ 357/23.7; 357/23.5; 357/23.9; 357/41; 357/49; 365/104; 365/184

[58] Field of Search .............. 357/23 TF, 20, 4, 23 S, 357/23 R, 41, 49, 40; 365/104

[56] References Cited

U.S. PATENT DOCUMENTS

| 3,584,183 | 6/1971 | Chiaretta | 357/4 |
| 3,840,888 | 10/1974 | Gaensslen et al. | 357/23 TF |
| 4,054,895 | 10/1977 | Ham | 357/23 TF |
| 4,296,428 | 10/1981 | Haraszti | 357/45 |

FOREIGN PATENT DOCUMENTS

| 52-34681 | 3/1977 | Japan | 357/23 TF |
| 53-26584 | 3/1978 | Japan | 357/23 TF |
| 54-114189 | 9/1979 | Japan | 357/40 |
| 54-130883 | 10/1979 | Japan | 357/23 TF |
| 55-29136 | 3/1980 | Japan | 357/23 TF |

OTHER PUBLICATIONS

Krick, IBM Tech. Discl. Bulletin, vol. 15, No. 2, Jul. 1972, pp. 466-467.

*Primary Examiner*—William D. Larkins
*Attorney, Agent, or Firm*—Walter G. Sutcliff

[57] ABSTRACT

A semiconductor device structure incorporating the edge of silicon island as a surface for diffusing impurities is described to form the drain and source of an MOS transistor and interconnections therebetween to form semiconductor devices such as MOS transistors, variable threshold MNOS transistors, row decoders for use in memories, memory arrays, interconnect crossovers, and high-voltage transistors. A semiconductor process is described for fabricating the above devices utilizing four or five masks.

The invention overcomes the problem of high-density integrated circuits by utilizing the edges of silicon islands on an insulating substrate as well as the upper surface of the islands. In addition, contact metallizations are non-critical because of the Schottky barrier diode formed between aluminum and n-type silicon. Both n and p-type semiconductor devices are described.

48 Claims, 43 Drawing Figures

DEVICE STRUCTURES FOR HIGH DENSITY INTEGRATED CIRCUITS

BACKGROUND OF THE INVENTION

1. Field of the Invention

This invention relates to integrated circuits and processes, and in particular to high density integrated circuits such as silicon-on-sapphire integrated circuits.

2. Description of the Prior Art

In the prior art integrated circuits have been made by treating the upper surface of a semiconductor wafer or a semiconductor layer on an insulating substrate to form impurity regions within the semiconductor material. The upper surface of the semiconductor material is usually oxidized to form a layer of thermal oxide which is then etched to form windows exposing the silicon material below. Impurities are driven into the semiconductor material through the window such as by diffusion or ion implantation. Each metal oxide semiconductor (MOS) transistor requires a drain and source which are formed through the top surface of the semiconductor. The windows formed in the insulation layer are limited in size by the resolution and alignment of the photomasking techniques. Additional surface area is consumed by the lateral diffusion of impurities if thermal diffusion is used. Ohmic contacts are normally made to selected regions by etching windows in the insulation layer, which is normally reformed by oxidation after every diffusion step and depositing aluminum or polysilicon over the insulation and exposed semiconductor material. The aluminum or polysilicon material is then etched to form an appropriate interconnection pattern. The wafer is scribed between individual integrated circuits and flexed to mechanically separate the integrated circuits from one another.

Integrated circuits which utilize a layer of semiconductor material over an insulating substrate such as sapphire are normally processed in a similar manner as a bulk silicon integrated circuit after semiconductor regions or islands have been formed to isolate the regions from one another. The semiconductor regions are normally formed by etching the semiconductor material through to the insulating substrate. For example, with silicon-on-sapphire wafers, the silicon grown on the sapphire is oriented with the <100> crystalline orientation pointed up and orthogonal to the upper surface of a semiconductor layer. During etching, the exposed sides or edges of the islands, which may for example be rectangular, are normally in the <111> which is well known in the art. The edges, for example, may have a light slope extending outward from the upper surface to the lower surface of the semiconductor material. The upper surface of the semiconductor material may be protected from etching by a mask of thermal oxide with a layer of silicon nitride deposited thereover. Individual devices such as n and p-type transistors have been made by forming windows in thermal oxide on the upper surface of a semiconductor material and diffusing or ion implanting impurities through the upper surface to form regions within the semiconductor islands.

An integrated circuit composed of a number of islands of semiconductor material have the advantage that the material of each island is isolated from the others by the insulating substrate and air, reducing isolation capacitance and permitting various voltages and n and p-type field effect transistors on respective islands.

One example of n and p channel transistors each formed on a respective silicon island is described in U.S. Pat. No. 4,183,134 issuing on Jan. 15, 1980 to Harry G. Oehler et al. entitled "High Yield Processing for Silicon-On-Sapphire CMOS Integrated Circuits" and assigned to the assignee herein. In U.S. Pat. No. 4,183,134 the device is planarized by growing a silicon dioxide layer between silicon islands such that the surface of the silicon dioxide layer is at approximately the same height above the sapphire substrate as the silicon islands. By planarizing the device that edges or sides of the silicon island were covered with silicon dioxide and are no longer exposed. The planar surface between the silicon islands and the silicon dioxide in between facilitated metallization patterns which did not have to traverse the edges or sides and corners of the silicon islands going from one island to another.

Another example of a silicon-on-sapphire integrated circuit is described in U.S. Pat. No. 3,889,287 issuing on June 10, 1979 to Michael W. Powell entitled "MNOS Memory Matrix". In U.S. Pat. No. 3,889,287 a matrix or an array of metal nitride oxide silicon (MNOS) field effect transistors are formed and interconnected from a silicon layer on sapphire which has been etched to form a number of ladder structures arranged side by side. The thickness of the semiconductor layer is approximately one micrometer. The memory transistors are formed on the rungs of the ladder with a gate electrode of polysilicon 5 micrometers wide passing over top the side rails and rungs of the ladders forming a row while the side rails of the ladder structure form a column to connect the drains and sources respectively. A diffusion is made into the side rails which are exposed which passes underneath the polysilicon gate electrode at the side rail to form a continuous path down the side rail and impurities diffused towards the memory transistor at the rung of the ladder structure to form the drain and source regions of the memory transistor. The polysilicon gate row is isolated from the ladder structures by a layer of silicon oxide and silicon nitride grown over the semiconductor material.

It is therefore desirable to provide high density transistor device structures which utilize the edges of silicon islands.

It is further desirable to diffuse impurities into the edges of semiconductor islands to form source and drain regions and to provide interconnection paths.

It is further desirable to form an MOS transistor along the edge of a silicon island.

It is further desirable to use strips or bars of silicon 4 micrometers wide to make MOS transistors across the bar and along the edge.

It is further desirable to utilize aluminum metallization for contacts which may form ohmic contacts with p regions and Schottky barrier diodes when in contact with adjacent n regions.

It is further desirable to use a new MOS transistor structure in a high density read only memory array.

It is further desirable to use a new transistor device structure to make a high voltage transistor.

It is further desirable to use a new metal nitride oxide semiconductor (MNOS) variable threshold transistor structure in a high density memory array.

It is further desirable to use a new structure for making crossovers for interconnection patterns.

It is further desirable to use a new transistor device structure to form row decoders for use in read only memories and random access memories.

It is further desirable to utilize new transistor structures to form high density circuit transmission switches.

It is further desirable to utilize a fabrication process which requires five masks.

It is further desirable to utilize a fabrication process which, even though it is high density, makes alignment of contacts to the drain and source regions non-critical.

SUMMARY OF THE INVENTION

In accordance with the present invention, process and semiconductor devices are provided for implementing high density circuits on insulating substrates comprising an insulating substrate with a semiconductor layer having an upper and lower surface positioned on an insulating substrate and having a predetermined thickness. Portions of the semiconductor layer are removed to form edges or side surfaces extending between the upper and lower surface of a semiconductor layer. A transistor may be formed across a silicon island which may, for example, be rectangular or a bar in shape by doping the edges across from one another with impurities to form a source and drain region while the upper surface of the semiconductor layer is masked, for example, with a layer of silicon oxide and silicon nitride. The mask may be stripped off following diffusion and a thermal oxide layer grown between the drain and source regions to form a gate region. Aluminum or polysilicon may be deposited over top of the gate region to form the gate. Contact may be made to the drain and source regions by exposing the drain and source and a portion of the semiconductor substrate and depositing aluminum thereover the alignment of which is non-critical if the semiconductor substrate is n type.

A second transistor structure comprises utilizing one edge of a semiconductor island on an insulating substrate and diffusing impurities into the edge with a strip of deposited silicon oxide masking a region of the edge from impurities. The upper surface of the semiconductor is masked by, for example, a silicon oxide and silicon nitride layer. The spaced-apart edge diffusions may form the drain and source of an edge transistor. The deposited silicon oxide may be removed and thermal oxide grown on the edge to form a suitable gate dielectric and aluminum or polysilicon may be deposited over the edge over the thermal oxide to form the gate electrode. The diffusions for the drain and source may extend along the edge and exposed at an appropriate point along with a portion of the substrate upper surface to form an ohmic contact between the aluminum or polysilicon and the drain and source respectively. If the substrate is n-type material, a Schottky barrier diode will form between the aluminum and the n-type substrate resulting in non-critical alignment of the contact metallization.

A silicon island having a rectangular shape and a minimum width of two to four microns may be used. The gate electrode for the across-the-island transistor structure and along-the-edge transistor structure may be combined to form compact transmission switches and circuits.

Several long silicon islands in the shape of a strip or bar may be used to form row decoders applicable to read only memories and random access memories.

Several columns of silicon islands in the shape of a strip or bar with transverse metallization or polysilicon across a number of islands may utilize new MOS and MNOS transistor structures to form memory arrays for read only and random access memories.

Process steps for implementing the across-the-island or edge transistor structures utilize five masking steps. The drain and source regions for the new transistor structure may be formed by edge diffusion or by ion implantation. Isolation or masking between two adjacent edge diffusions is achieved with deposited silicon oxide.

DESCRIPTION OF THE PREFERRED EMBODIMENT

Figure 1:
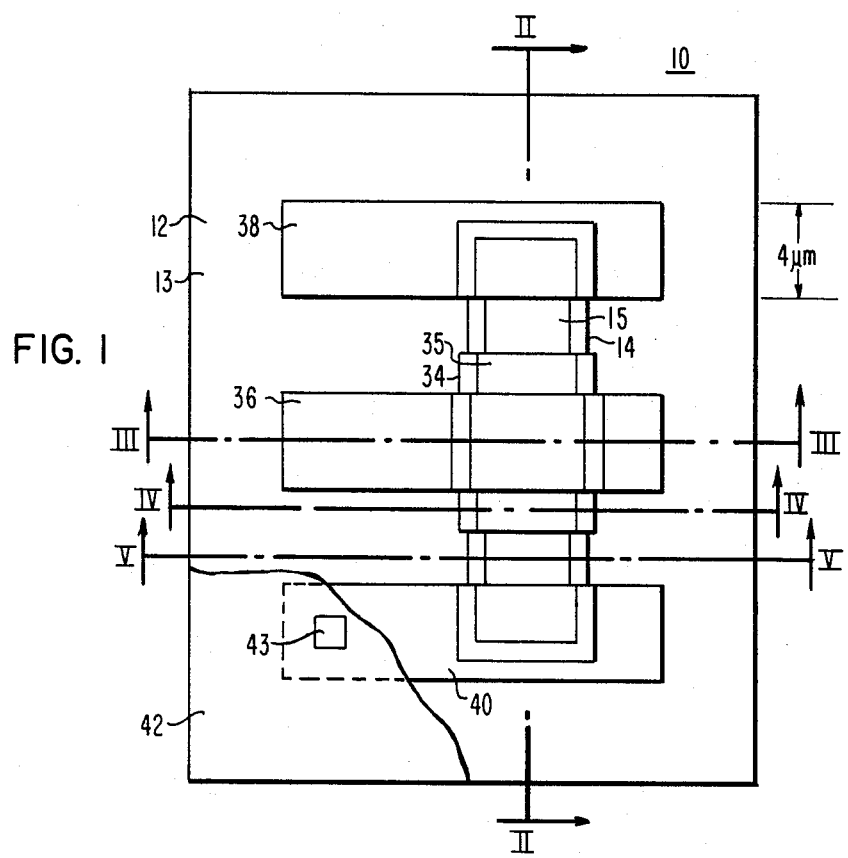
FIG. 1 is a plan view of one embodiment of the invention.
Figure 2:
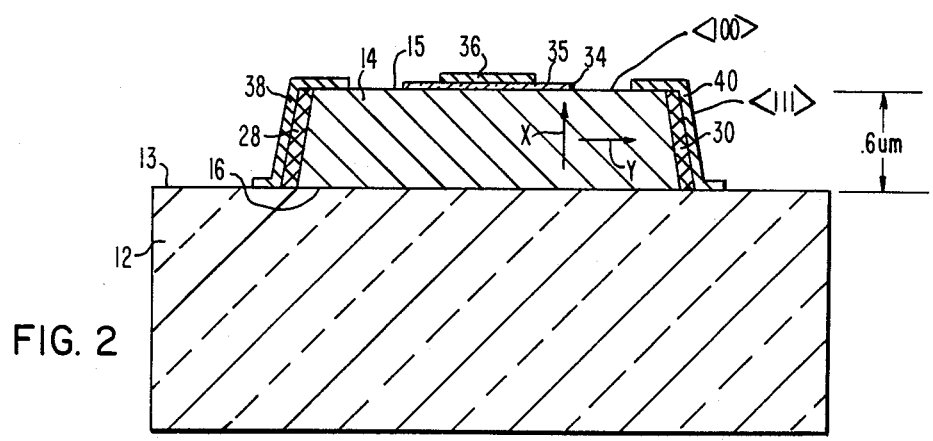
FIG. 2 is a cross-section view along the lines II—II of FIG. 1.
Figure 3:
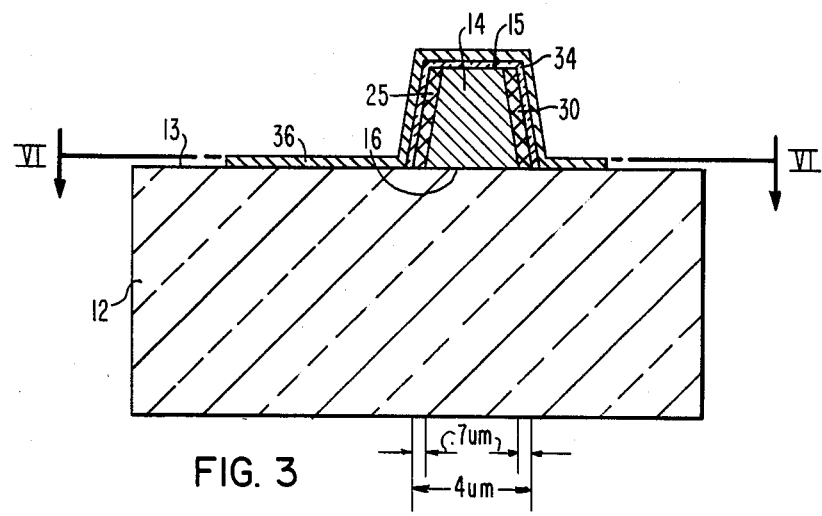
FIG. 3 is a cross-section view along the lines III—III of FIG. 1.
Figure 4:
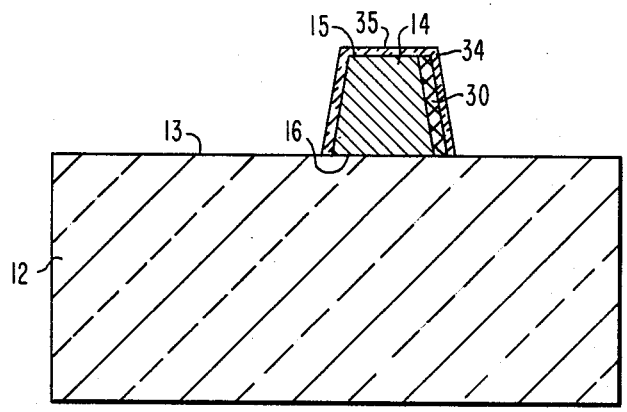
FIG. 4 is a cross-section view along the lines IV—IV of FIG. 1.
Figure 5:
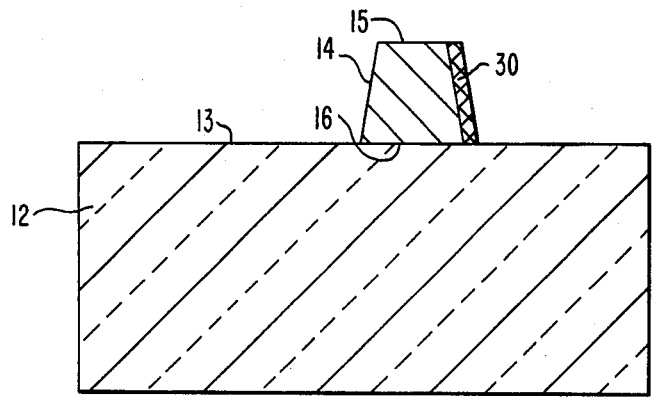
FIG. 5 is a cross-section view along the lines V—V of FIG. 1.
Figure 6:
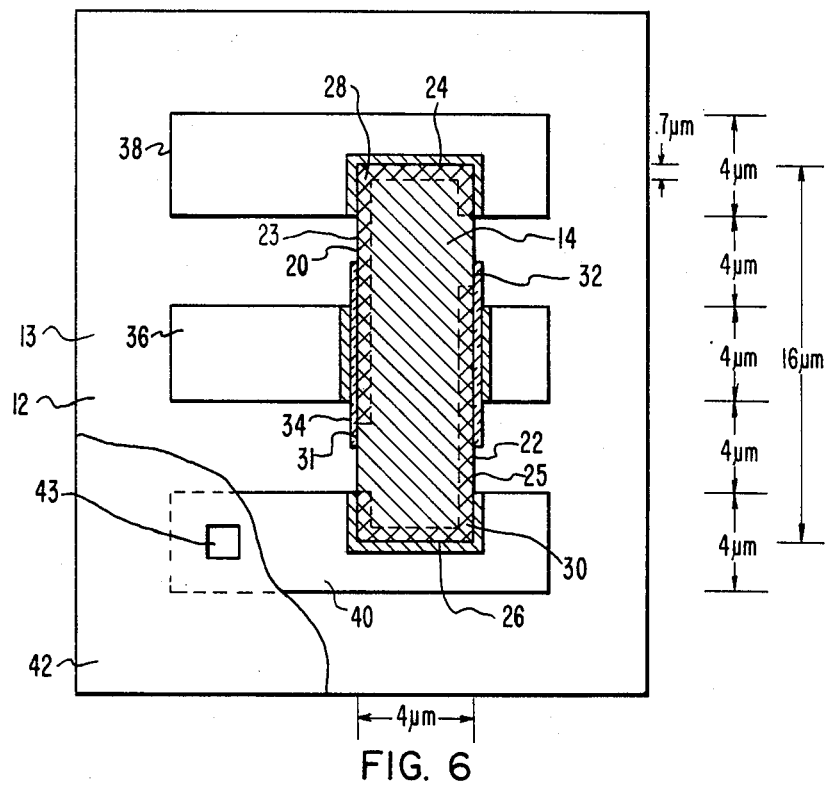
FIG. 6 is a cross-section view along the lines VI—VI of FIG. 3.

Referring to the drawing and in particular to FIG. 1 is a plan view of a semiconductor device 10 is shown. Insulating substrate 12 has an upper surface 13. Insulating substrate 12 may be, for example, sapphire, aluminum oxide or spinel. FIG. 2 is a cross-section view along the lines II—II of FIG. 1 and shows a semiconductor layer 14 having an upper surface 15 and a lower surface 16 positioned on the upper surface 13 of insulating substrate 12. Semiconductor layer 14 has a predetermined thickness or depth. Semiconductor layer 14 may also be an island of semiconductor material which is rectangular in shape as shown in FIGS. 3 through 6. Semiconductor layer 14 may, for example, be 0.6 micrometers thick and 4 micrometers wide as shown in FIG. 3. Semiconductor layer 14 may, for example, be 16 micrometers long as shown in FIG. 6.

Semiconductor layer 14 may be doped with impurities to exhibit n-type material having a resistivity of 20 ohms centimeters. Impurities of a second type are diffused or driven into selected areas 20 and 22 of sides 23 through 26 of semiconductor layer 14. The selected areas extend from the lower and upper surface of semiconductor layer 14. For example, a p+ diffusion such as boron or a boron implantation may extend from the edge or sides 23 through 26 to a depth in the range of 0.6 to 0.7 micrometers. As shown in FIGS. 1 through 6 two regions 28 and 30 are shown extending a predetermined length along the edge of semiconductor layer 14. Regions 28 and 30 are electrically isolated from one another by selected areas 31 and 32 which extend from the upper to the lower surface and exhibit n-type material the same as semiconductor layer 14. It is understood that semiconductor layer 14 has sufficient width such as 4 microns such that edge diffusions from opposite sides will not meet in the middle and that the middle portion will remain n-type material. FIG. 6 clearly shows regions 28 and 30 in relation to the remaining portion of semiconductor layer 14. If regions 28 and 30 are diffused, selected areas 31 and 32 may be protected from diffusion by a deposition of silicon dioxide, also known as silox, which may cover the selected areas 31 and 32 on edges 23 and 25. The upper surface 15 may be protected by a layer of thermal oxide which may be, for example, 400 angstroms thick and a layer of silicon nitride thereover which may be, for example, 2000 angstroms thick. After regions 28 and 30 are formed, the thermal oxide layer and the silicon nitride layer may be stripped or removed along with the silicon dioxide deposition to expose the four sides 23 through 26 and upper surface 15 of semiconductor layer 14. A layer of thermal oxide 34 may be grown on the upper surface 15 and sides 23 through 26 of semiconductor layer 14 which may be, for example, 400 to 800 angstroms thick. The silicon dioxide layer or insulation layer 34 extends over the upper surface of semiconductor layer 14 from region 28 to region 30. A layer of conductive material 36 is deposited or positioned over the insulation layer 34 and extends between region 28 and 30 to form a field effect transistor having a gate electrode 36 and drain and source regions 28 and 30 which may be interchangeable depending upon the voltage applied. Another example of conductive material 36 may be polysilicon. As shown in FIGS. 1, 3 and 6 conductive material 36 may be deposited on the upper surface of insulating substrate 12 and over side 23 to the top upper surface 35 of insulation layer 34 and down the other side 25 to the upper surface 13 of insulating substrate 12. As shown in FIGS. 1, 3 and 6 semiconductor layer 14 has sloped sides, but even if the sides were vertical, conductive material 36 would be deposited to a thickness to assure conductivity in conductive material 36 as it passes over sides 23 and 25.

Openings may be etched in insulation layer 34 to expose regions 28 and 30 for ohmic contact to aluminum. For example, each end of semiconductor layer 14 extending from sides 24 and 26 may be etched to expose the ends. A layer of aluminum is then deposited thereover and etched to form electrodes 38 and 40. It is understood that the etched diffusion if it is only 0.6 to 0.75 microns deep provides a small area for contact if the aluminum was not allowed to touch the n-type material forming the body of transistor 10. However, the arrangement as shown in FIGS. 1 and 2 show electrodes 38 and 40 in direct contact with regions 28 and 30 respectively and the n-type material of semiconductor layer 14. The aluminum when deposited over the n-type material of semiconductor layer 14 forms a blocking Schottky barrier diode. The aluminum over the p+ regions 28 and 30 form ohmic contact which is desired. By utilizing aluminum for electrodes 38 and 40 and by permitting the formation of a blocking Schottky barrier diode between electrode 38 and the n-type material of semiconductor layer 14 or between electrode 40 and semiconductor layer 14, the alignment of electrodes 38 and 40 with respect to regions 28 and 30 are non-critical. For example, typical alignment tolerances may be in the range of ±1 microns to ±2 micrometers.

Electrodes 36, 38 and 40 may, for example, be 4 microns wide and be spaced apart by 4 microns.

A layer of silicon dioxide or silox may be deposited over the electrode and semiconductor layer 14 to provide passivation which is well known in the semiconductor art. A cut-away view of silicon dioxide layer 42 is shown in FIG. 1. A via or opening 43 in silicon dioxide layer 42 is shown in FIG. 1, not to scale in FIG. 1, to permit ohmic contact to electrode 40.

Semiconductor device 10 as shown in FIGS. 1 through 6 is a p channel MOS transistor formed between two edges or across semiconductor layer 14 having a gate electrode 36 and a drain and source region 28 and 30 respectively. Gate electrode 36 when properly biased with a voltage causes a channel to form below upper surface 15 between regions 28 and 30. The n channel semiconductor devices may be fabricated by interchanging n and p type material and diffusions.

Figure 7:
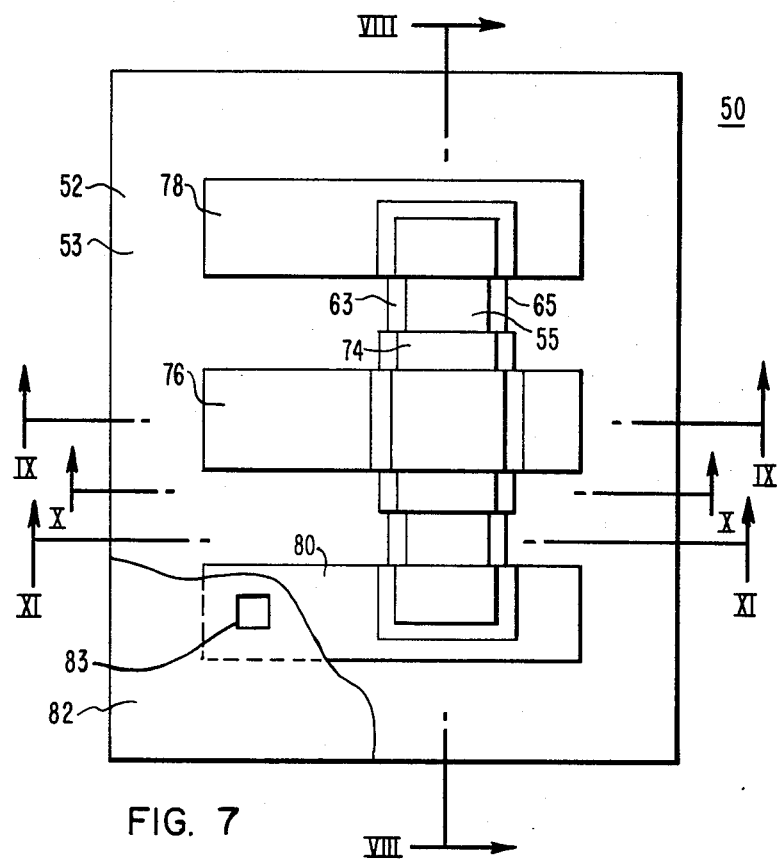
FIG. 7 is a plan view of an alternate embodiment of the invention.

Referring to FIG. 7, a plan view of an alternate embodiment of the invention, semiconductor device 50, is shown. FIGS. 8 through 12 show various cross-section views of the embodiment in FIG. 7. In FIG. 7, insulating substrate 52 which may be, for example, sapphire, aluminum oxide or spinel and has an upper surface 53. A semiconductor layer 54 has an upper surface 55 and a lower surface 56 and is positioned on insulating substrate 52. Semiconductor layer 54 has a predetermined thickness such as, for example, 0.6 microns. As shown in FIG. 7, and more particularly in FIG. 12, semiconductor layer 54 is rectangular in shape having sides or sidewalls 63 through 66. For example, side or sidewall 65 extends between upper surface 55 and lower surface 56 of semiconductor layer 54. Semiconductor 54 is doped with impurities to exhibit a first type of material such as n type. Sidewall 65 is doped with impurities of a second type such as p type to a predetermined depth in two selected areas 60 and 62 which are spaced apart to form first and second spaced-apart regions 68 and 70 of p-type characteristics along side wall 65. It is understood that the impurities may be driven to a predetermined depth along sidewall 65 by diffusion or by ion implantation. Regions 68 and 70 may be formed by diffusing impurities into sidewall 65 at times when upper surface 55 of semiconductor layer 54 is covered with 400 angstroms of silicon dioxide and 2000 angstroms of silicon nitride. Impurities may be prevented from diffusing into sidewall 65 in the space between regions 68 and 70 by depositing silicon dioxide on edge 65 to mask out the impurities. The semiconductor layer 54 between regions 68 and 70 is n-type material. After regions 68 and 70 are formed the silicon dioxide, silicon nitride and silox may be stripped off and 400 to 800 angstroms of silicon dioxide may be regrown on upper surface 55 of semiconductor layer 54 and on sidewall 65. Side walls 64 through 66 may also have a layer of thermal oxide deposited at the same time. The thermal oxide or insulation layer 74 extends between regions 68 and 70 on side wall 65 and forms the gate dielectric of the semiconductor device 50. A conductive material or electrode 76 is deposited or positioned over the upper surface 75 of insulation layer 74 and extends between regions 68 and 70 along sidewall 65 to function as the gate electrode. Conductive material 76 may, for example, be aluminum or polysilicon and as shown in FIG. 7 extends over semiconductor layer 54 and onto insulating substrate 52 on either side of semiconductive layer 54. The important area is on sidewall 65 and the electrode 76 need not cross over the layer 54. As shown in FIG. 7 the sidewalls of semiconductive layer 54 are slightly sloped outward as they approach insulating substrate 52. If, however, the sidewalls were vertical, sufficient conductive material would be deposited to assure continuity of electrode 76 as it passes over semiconductive layer 54. Insulation layer 74 is removed at either end of semiconductive layer 54 to expose regions 68 and 70. An ohmic contact is made to regions 68 and 70 by depositing aluminum or electrodes 78 and 80 over the exposed regions 68 and 70 respectively and over exposed n-type material of semiconductive layer 54. The aluminum will form a blocking Schottky barrier diode with the n-type material of semiconductive layer 54. The aluminum will form an ohmic contact with the p+ regions 68 and 70. The mask alignment for forming electrodes 78 and 80 are non-critical since the aluminum may contact the n-type material of semiconductor layer 54 while making ohmic contact to regions 68 and 70.

Semiconductor device 50 therefore has a drain and source defined by regions 68 and 70 which may be interchangeable depending upon the voltage bias and a gate formed by electrode 76. The channel of the semiconductor device is along the sidewall 65 or edge of semiconductor layer 54 between regions 68 and 70.

Figure 12:
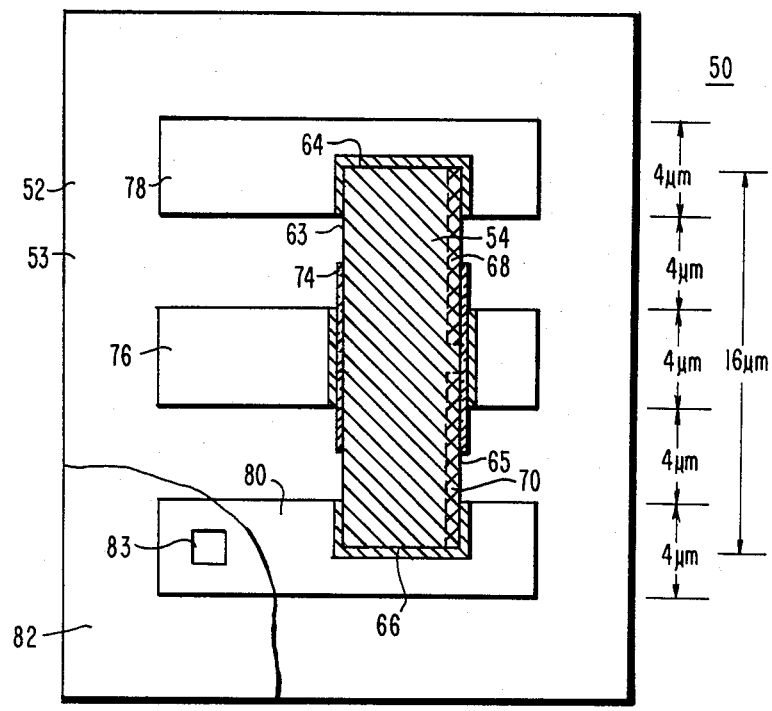
FIG. 12 is a cross-section view along the lines XII—XII of FIG. 9.

A cut-away view of passivation 82 which may, for example, be silicon dioxide or silox is deposited over semiconductor layer 54 and electrodes 76, 78 and 80 to passivate semiconductor device 50. Vias or openings 83, not to scale in FIG. 12, are made for contact to electrodes 76, 78 and 80. In the embodiment of FIG. 7, regions 68 and 70 could extend along sides 64 and 66 and part way along side 63. Regions 68 and 70 are flexible as to their length along sidewall 65 and other sidewalls so long as ohmic contact may be made to them and so long as a gate electrode may overlie the sidewall and separated therefrom by a gate dielectric to cause a channel to form between regions 68 and 70 upon appropriate biasing of the gate electrode.

In FIG. 7 semiconductor layer 54 is 4 micrometers wide and 16 micrometers long and 0.6 micrometers thick. Electrodes 76, 78 and 80 are each 4 micrometers wide and are spaced apart by 4 micrometers. The n channel semiconductor devices may be fabricated by interchanging n and p type material and diffusions.

Figure 13:
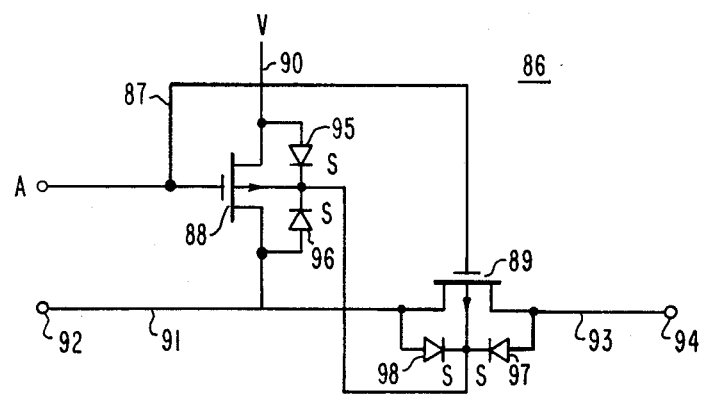
FIG. 13 is a circuit schematic of a transmission switch.

Referring to FIG. 13, a circuit schematic of a transmission switch with a load or current source is shown which is useful in integrated circuits. A control signal A which functions to turn on and off transmission switch 86 is coupled over line 87 to the gate of transistors 88 and 89. The source of transistor 88 is coupled over line 90 to a suitable voltage for providing a charging current through transistor 88. The drain of transistor 88 is coupled over line 91 to one side of transistor 89 acting either as a drain or source and to terminal 92 representing one side of transmission switch 86. The other side of transistor 89 is coupled over line 93 to terminal 94 for coupling a signal on the other side of transmission switch 86. Transistor 89 functions as a low conductance path at times transistor 89 is on for coupling terminal 92 to terminal 94. Transistor 88 functions to provide a load or pull-up current on line 91 at times transistor 88 is on. Schottky barrier diodes 95 through 98 are not necessary for transmission switch 86 but may be present due to the implementation of transistors 88 and 89.

Figure 14:
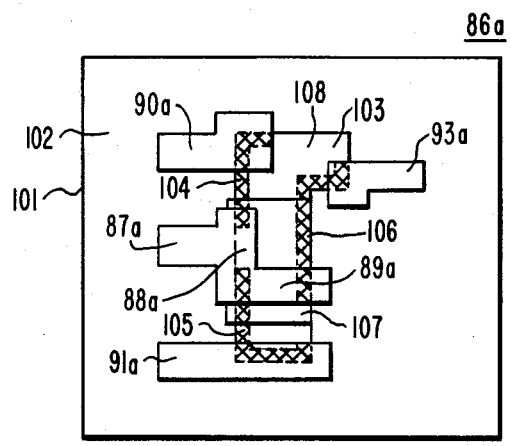
FIG. 14 is a plan view of an implementation of FIG. 13 using the embodiments of FIGS. 1 and 7.

FIG. 14 shows a plan view of an alternate embodiment of the invention implementing transmission switch 86 in integrated circuit form. In FIG. 14 line 87 is electrode 87a. Lines 90, 91 and 93 are shown in FIG. 14 as electrodes 90a, 91a and 93a, respectively. In FIG. 14 an insulating substrate 101 is shown having an upper surface 102. Positioned on upper surface 102 is semiconductor layer 103 shaped in an L pattern. Semiconductor layer 103 may, for example, be silicon having a top surface in the <100> plane and side edges in the <111> crystalline plane. Semiconductor layer 103 may be doped with phosphorus to form an n-type material having a resistivity of 20 ohms centimeter. Impurities such as boron may be diffused or implanted into the edges of semiconductor layer 103 with certain portions of the edge being masked or blocked from the introduction of impurities. As a result, as shown in FIG. 14, impurity regions 104, 105 and 106 are formed around the perimeter of semiconductor layer 103 and have a depth into semiconductor layer 103 from the edge of approximately 0.7 micrometers. Impurity regions 104 and 105 are spaced apart by a predetermined distance such as 4 micrometers along the perimeter or sidewall of semiconductor layer 103. Impurity region 106 is positioned across from impurity region 105 separated by a predetermined distance of approximately 4 micrometers, the width of semiconductor layer 103 at that position. An insulating layer 107 is formed over the edge and upper surface 108 so as to cover the edge between impurity regions 104 and 105 and the upper surface between impurity regions 105 and 106. Overlaying insulation layer 107 is electrode 87a which may, for example, be aluminum or polysilicon. Electrode 87a extends along the edge from impurity regions 104 to 105 and along the upper surface 103 from impurity region 105 to 106.

Impurity region 104 acts as a source of an edge transistor 88a having a drain implemented impurity region 105. A channel is formed adjacent the sidewall during conduction. Transistor 88a, for example, is shown in further detail in FIG. 7 by semiconductor device 50. Impurity regions 105 and 106 form the drain and source which may be interchangeable of transistor 89a. Transistor 89a utilizes the upper surface 108 of semiconductor layer 103 between impurity regions 105 and 106 to form a channel during conduction which is dependent upon the voltage on electrode 87a. One example of transistor 89a shown in more detail is semiconductor device 10 in FIG. 1. The exposed upper surface 108 is in contact with electrodes 90a, 91a and 93a which forms Schottky barrier diodes 95 through 98. Electrode 90a is also in ohmic contact with impurity region 104. Electrode 91a is in ohmic contact with impurity region 105. Electrode 93a is in ohmic contact with impurity region 106. As shown in FIG. 14 electrodes 90a, 91a and 93a and gate electrode 87a have a minimum of 4 micrometers width and are spaced apart by at least 4 micrometers. Semiconductor layer 103 may be 0.6 micrometers thick and has a minimum width of 4 micrometers. Impurity regions 104, 105 and 106 are spaced apart along the perimeter or edge of semiconductor layer 103 by 4 micrometers.

When gate 87a is at a predetermined negative voltage with respect to the source, transistors 88a and 89a are turned on and provide a conductive path between impurity regions 104 to 105 and between 105 and 106. The characteristic of the transistors are determined by the length and width of the channel and by the capacitance and doping level of the semiconductor.

Figure 15:
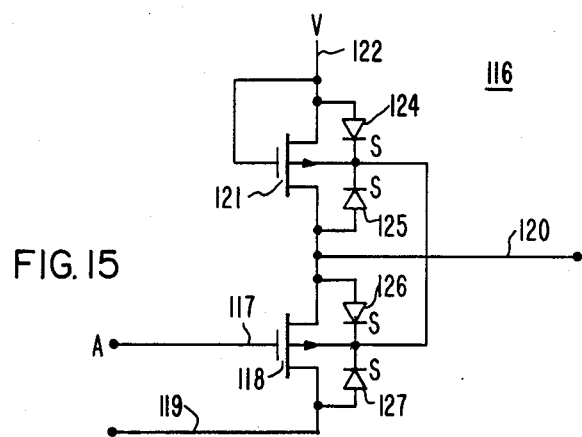
FIG. 15 is a circuit schematic of a transmission switch.

FIG. 15 is a circuit schematic of an alternate transmission switch. Transmission switch 116 is controlled by a control signal A on line 117 which is coupled to the gate of transistor 118. One side of transistor 118 is coupled to line 119 by its drain or source which may be interchangeable. The other side of transistor 118 is coupled over line 120 to the drain of transistor 121 and also acts as an output from transmission switch 116. The output on line 120 and the input on line 119 may be interchangeable to pass data or control signals through transistor 118. Transistor 121 acts as a load or current source and has its source and gate coupled together over line 122 to a voltage source which may, for example, be ground or positive with respect to the signals on line 120. The drain and source of transistor 121 may be coupled to the body through Schottky barrier diodes 124 and 125. The drain and source of transistor 118 may be coupled to the body of the transistor 118 through Schottky barrier diodes 126 and 127. The Schottky barrier diodes may be present due to the construction of transmission switch 116 in integrated circuit form.

Figure 16:
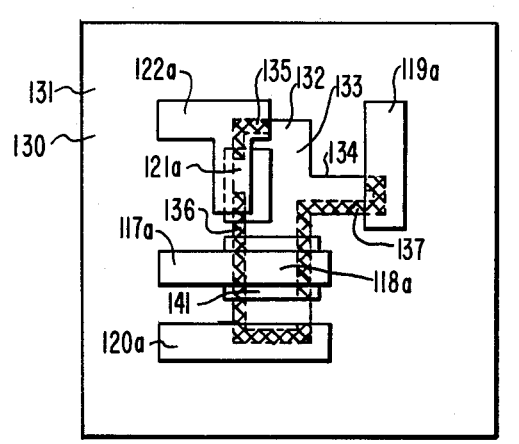
FIG. 16 is a plan view of an implementation of FIG. 15 using the embodiments of FIGS. 1 and 7.

FIG. 16 is a plan view of an embodiment implementing transmission switch 116. In FIG. 16 the suffix a to the reference numeral, such as 121a, corresponds to the schematic function by the same reference numerals without the suffix in FIG. 15. In FIG. 16 insulating substrate 130 has an upper surface 131. Semiconductor layer 132 is positioned on upper surface 131 which may, for example, be silicon. Semiconductor layer 132 has an upper surface 133 and an edge or sidewall around the perimeter 134. Semiconductor layer 132 is shaped in the form of a rectangle with a smaller rectangle attached to one of its longer sides. Semiconductor layer 132 is doped with impurities to form an n-type material having approximately 20 ohm centimeters resistance. P-type impurities are diffused into the edges or sidewalls 134 of semiconductor layer 132 to form three separate impurity regions which extend 0.7 micrometers into semiconductor layer from the edge 134. Impurity regions 135, 136 and 137 are shown in FIG. 16 which function as the drain and source of the transistors 118a and 121a and also are extending along the sidewall to provide ohmic contact to the electrodes. Transistor 121a has impurity region 135 acting as its source and impurity region 136 acting as its drain. The impurity regions 135 and 136 are spaced apart by a predetermined amount. During the formation of impurity regions 135 and 136, a mask such as silicon oxide on the edge 134 prevented impurities from diffusing into the region between impurity regions 135 and 136. An insulation layer 140 extends along the edge 134 between impurity regions 135 and 136 and on the upper surface 133 as shown in FIG. 16. A gate electrode 122a is deposited over the insulation layer along the edge 134 between impurity regions 135 and 136. Impurity region 136 extends along edge 134 to form either the drain or source of transistor 118a and extends further along edge 134 to provide an ohmic contact with electrode 120a. Impurity region 137 is positioned along sidewall 134 across from impurity region 136 to provide the drain or source of transistor 118a and extends along edge 134 to provide an ohmic contact with electrode 119a. Over upper surface 133 and over impurity regions 136 and 137 is insulation layer 141 which functions to provide a gate dielectric and to insulate electrode 117a from semiconductor layer 132. Electrode 117a provides a gate for transistor 118a and extends on insulation layer 141 from impurity region 136 to impurity region 137. Transistor 121a is an edge transistor similar to the one shown in FIG. 7 as semiconductor device 50. Transistor 118a is an across-the-layer transistor similar to the one shown in FIG. 1 as semiconductor device 10. Electrodes 119a, 120a and 122a make ohmic contact to the respective impurity region below and also to semiconductor layer 132 forming a Schottky barrier diode represented in FIG. 15 by diodes 124 through 127.

Figure 17:
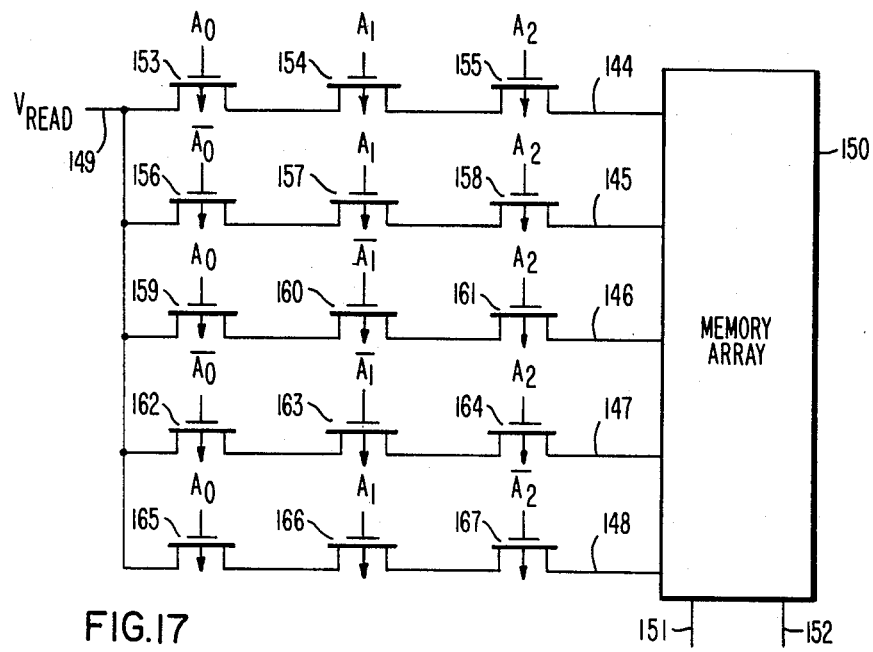
FIG. 17 is a circuit schematic of a row decoder.

FIG. 17 shows a circuit schematic of a row decoder in a memory system. In FIG. 17, unique combinations of address signals A0 through A2 and $\overline{A}_0$ through $\overline{A}_2$ are coupled to the gates of several transistors coupled in series to form a decoding tree to determined which line 144 through 148 is coupled or has a conductive path to line 149 which is coupled to a voltage such as $V_{read}$. For example, when the voltage $V_{read}$ is coupled to one of the lines 144 through 148 the memory cells in memory array 150 associated with the selected row would be read and provide an output on lines 151 and 152 which is well known in the art. Transistors 153 through 155 are coupled in series between line 149 and line 144 to form one decode path. Transistors 156 through 158 are coupled in series between line 149 and line 145. Transistors 159 through 161 are coupled in series between line 149 and line 146. Transistors 162 through 164 are coupled in series between line 149 and line 147. Transistors 165 through 167 are coupled in series between lines 149 and 148. Address signal $A_0$ is coupled to the gate of transistors 153, 159 and 165. Address signal $\overline{A}_0$ is coupled to the gate of transistors 156 and 162. Address signal $A_1$ is coupled to the gate of transistors 154, 157 and 166. Address signal $\overline{A}_1$ is coupled to the gate of transistors 160 and 163. Address signal $\overline{A}_2$ is coupled to the gate of transistors 155, 158, 161 and 164. Address signal $\overline{A}_2$ is coupled to the gate of transistor 167.

Figure 18:
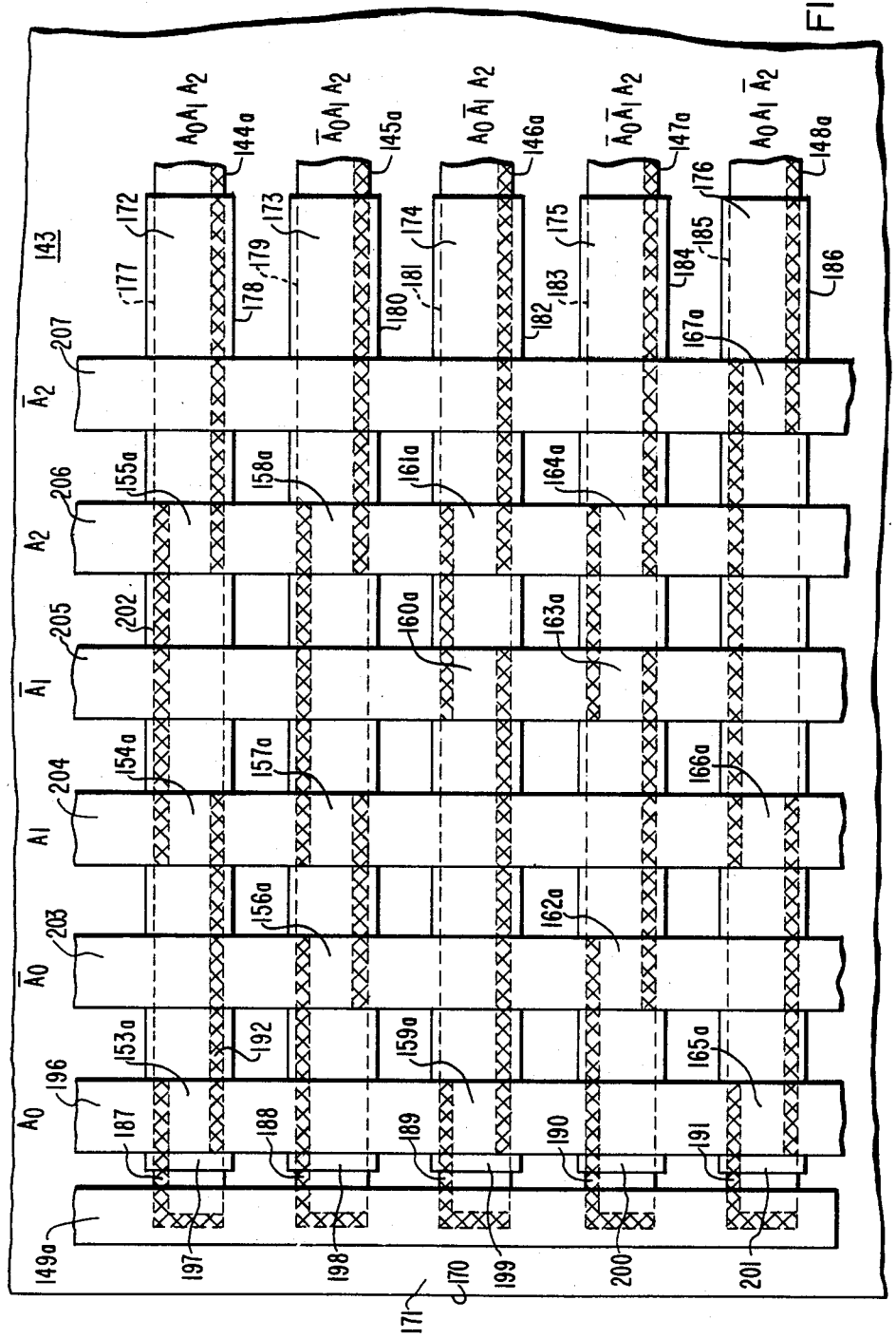
FIG. 18 is a plan view of an implementation of FIG. 17 using the embodiment of FIG. 1.

FIG. 18 is a plan view of an embodiment implementing row decoder 143 shown in FIG. 17. In FIG. 18 reference numerals with a suffix a, correspond to transistors and lines with the same reference without the suffix shown in FIG. 17. In FIG. 18 insulating substrate 170 has an upper surface 171. Deposited or formed on upper surface 171 are silicon bars or strips 172 through 176 which may, for example, be formed by etching a silicon layer previously deposited on insulating substrate 170. Silicon strip 172 has elongated edges or side surfaces 177 and 178 extending from the upper surface to the lower surface of silicon strip 172. Silicon strips 173 through 176 likewise have two edges each exending along the strip identified as edges 179 through 186. Each silicon strip 172 through 176 is doped with impurities to form n-type material having a resistance of 20 ohms centimeter for example. Impurities of a p type are diffused or implanted into the edges of strips 172 through 176 in selected areas and prevented from being diffused into other areas in strips 172 through 176. The depth of impurity penetration is approximately 0.7 micrometers from the edge. Electrode 149a makes ohmic contact with impurity regions 187 through 191 in strips 172 through 176. Impurity regions on each strip are adjusted so that they are across the strip from one another to form the drain and source of a transistor. For example, on silicon strip 172 impurity regions 187 and 192 are across the strip from each other to form the drain and source of transistor 153a. Gate electrode 196 is deposited on top of insulation layer 197. Silicon strips 173 through 176 also are covered with an insulation layer such as silicon dioxide identified as insulation layers 198 through 201. Gate electrode 196 also traverses silicon strips 173 through 176 to function as a gate electrode for transistor 159a and 165a on silicon strips 174 and 176, respectively. No transistor is formed on the other silicon strips 173 and 175 because edge 180 and edge 184 underneath gate electrode 196 are free of impurities so that a transistor is not formed. Even if a channel is formed underneath electrode 196, the charge has nowhere to go.

Transistor 153a corresponds to the structure of semiconductor device 10 shown in FIGS. 1 through 6. Electrode 149a is coupled through a decode tree to impurity region 144a if transistors 153a through 155a are conducting permitting current to flow through the transistors and through impurity regions 187, 192, 202 and 144a. Since the gates of transistors 153a through 155a are coupled to address signals $A_0$, $A_1$ and $A_2$ impurity region 144a will be coupled to electrode 149a at times when the logic signals $A_0$, $A_1$ and $A_2$ are each a logic one. In this manner each silicon strip will have its last impurity region coupled to electrode 149a at times the gates of the transistors in series along that line are logically selected. In FIG. 18 the gate electrodes are 4 micrometers wide and may be aluminum or polysilicon. The silicon strips 172 through 176 may be 4 micrometers wide and have a depth of 0.6 micrometers. The spacing between electrodes and between silicon strips may, for example, be 4 micrometers. For high density memories, the pitch or spacing in the row decoder should match the spacing or pitch of rows in a memory array of cells.

Figure 19:
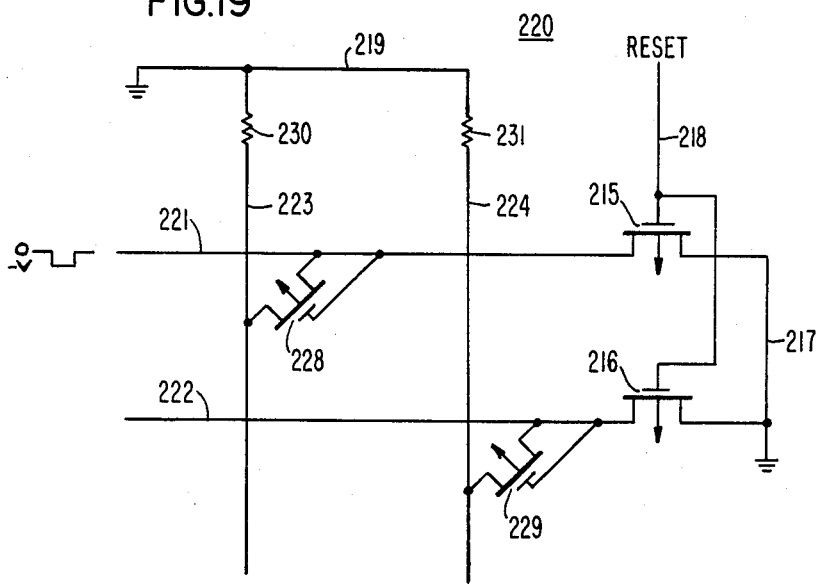
FIG. 19 is a circuit schematic of an array of transistors to form a read only memory.

FIG. 19 is a circuit schematic of a memory array of transistors for a read only memory, for example. In memory array 220, lines 221 and 222 form rows and lines 223 through 224 form columns. At the intersection of each row and column line a transistor may or may not be coupled thereacross. In a read only memory the presence of a transistor would provide one logic level on the column line and the absence of a transistor would leave the column line as it originally was in the other state. Transistor 228 has its gate and drain coupled to line 221. The source of transistor 228 is coupled to line 223, through resistor 230 to ground potential, for example. Transistor 229 has its drain and gate coupled to line 222. The source of transistor 229 is coupled to line 224, through resistor 231 to ground potential, for example. As is well known in the art if lines 223 and 224 are precharged to a potential such as ground and if line 221 is selected by bringing it from ground to a negative voltage, transistor 228 will be conducting causing line 223 to be pulled negative to a negative voltage. Meanwhile line 224 will remain at ground potential. Resistors 230 and 231 are shown coupled between ground and lines 223 and 224 respectively to precharge the lines. Memory array 220 may be one example of a suitable implementation of memory array 150 shown in FIG. 17. Lines 221 and 222 in FIG. 19 would be coupled to lines 144 and 145 respectively shown in FIG. 17 and lines 223 and 224 would be coupled to output lines 151 and 152 respectively shown in FIG. 17.

Figure 20:
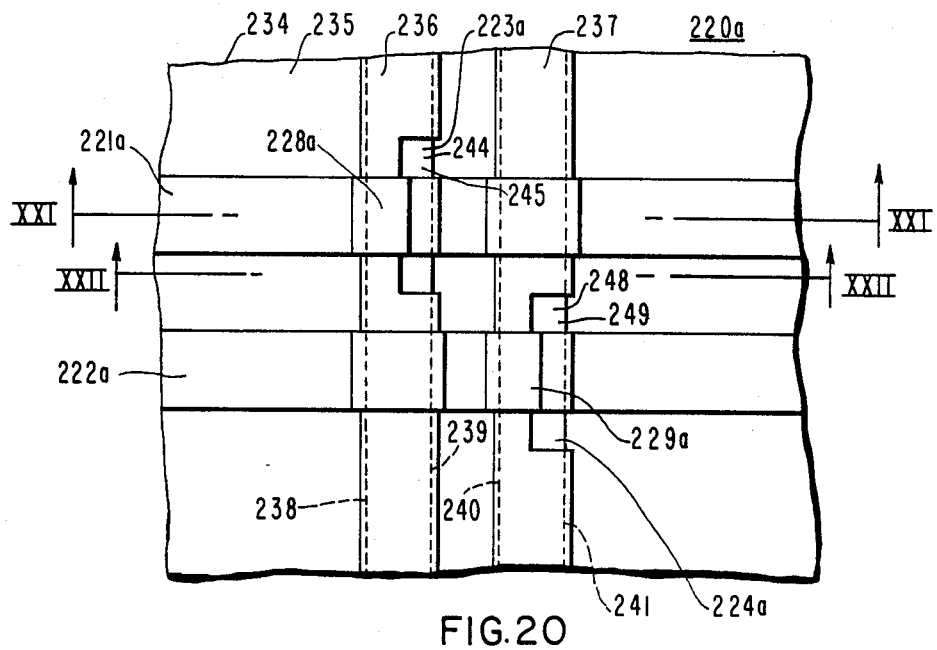
FIG. 20 is a plan view of an implementation of FIG. 19 using a second alternate embodiment of the invention.
Figure 21:
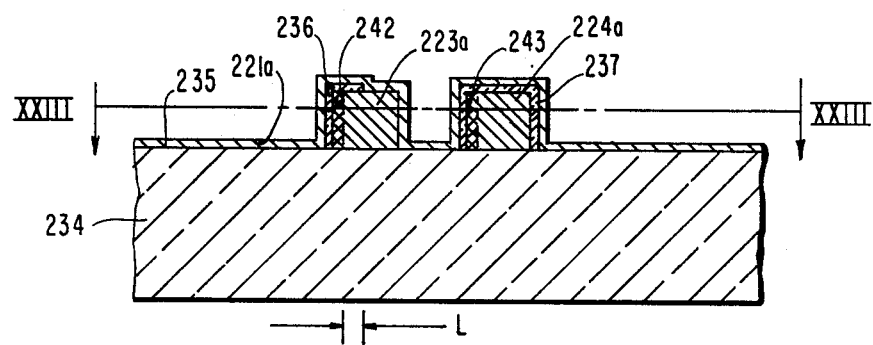
FIG. 21 is a cross-section view along the lines XXI—XXI of FIG. 20.
Figure 22:
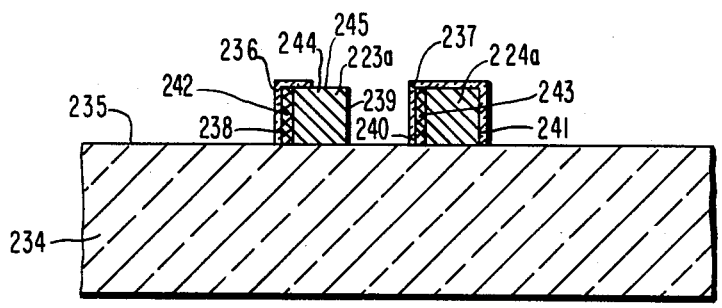
FIG. 22 is a cross-section view along the lines XXII—XXII of FIG. 20.
Figure 23:
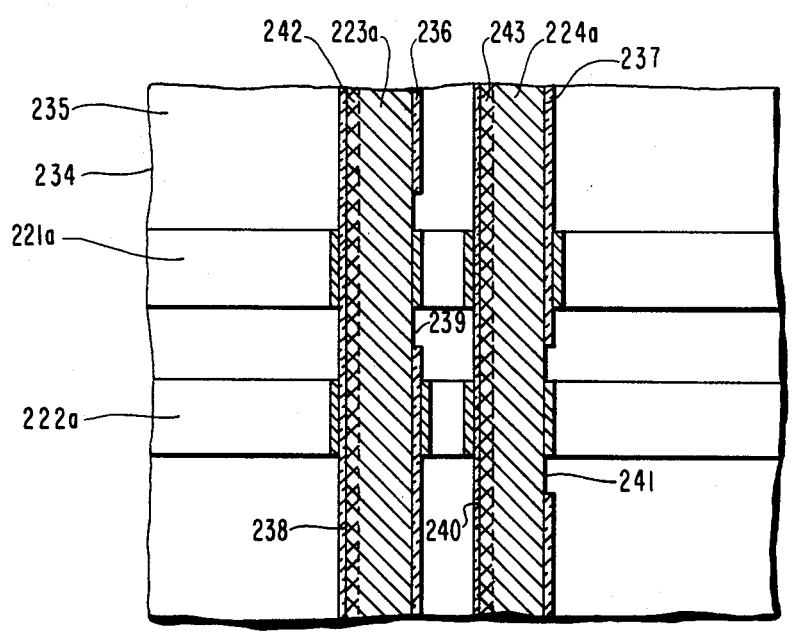
FIG. 23 is a cross-section view along the lines XXIII—XXIII of FIG. 1.

FIG. 20 is a plan view of an embodiment implementing memory array 220 shown in FIG. 19. In FIG. 20, reference numerals with a suffix a, correspond to the same reference numerals without the suffix in FIG. 19. In FIG. 20 insulating substrate 234 has an upper surface 235 which is smooth or substantially flat. Insulating substrate 234 may be, for example, sapphire, aluminum oxide or spinel. FIGS. 21 through 23 show cross sections of FIG. 20 illustrating in more detail the structure of memory array 220a. Two semiconductors strips or bars 223a and 224a are deposited on upper surface 235 having a depth of approximately 0.6 micrometers and a width of approximately 4 micrometers. Semiconductor strips 223a and 224a may, for example, be silicon and are covered with a thermal oxide or insulation layer 236 and 237 respectively. Semiconductor strips 223a and 224a are doped with n-type material. Semiconductor strip 223a has edges on either side of the strip running along the strip identified as edges 238 and 239. Semiconductor strip 224a has edges running along either side of the strip identified as edges 240 and 241. One edge of each strip such as edges 238 and 240 have p-type impurities diffused into the edge to a depth of 0.7 micrometers from the edge as shown in FIGS. 21 through 23. The region forms a low resistance conductive path aong the strip and functions as the source for transistors 228 and 229. An opening 244 in insulation layer 236 is provided, for example by etching, exposing the upper surface 245 of semiconductor strip 223a. The opening 244 starts at a predetermined distance L from impurity region 242 shown in FIG. 21. Insulation layer 237 has an opening 248 which is at a predetermined distance from impurity region 243. Opening 248 exposes the upper surface 249 of semiconductor strip 224a.

Gate electrode 221a which may, for example, be aluminum or polysilicon is deposited over and transverse to semiconductor strips 223a and 224a. Gate electrode 221a is deposited over opening 244 and onto semiconductor strip 223a. Likewise gate electrode 222a is deposited transverse to semiconductor strips 223a and 224a and is deposited over opening 248 and onto semiconductor strip 224a. The intersection of strips 223a and 224a with gate electrodes 221a and 222a form a transistor if there is an opening in the insulation layers 236 and 237 allowing the gate electrode to come in contact with the semiconductor strip. If there is no opening in insulation layers 236 and 237 at the area of intersection, then no transistor is formed. Transistor 228a is formed by the impurity region 242 acting as a source, electrode 221a acting as a gate, Schottky barrier diode functioning as the drain, and insulation layer 236 acting as a gate dielectric. The spacing between impurity region 242 and the contact of electrode 221a with the upper surface 245 provides a series impedance and channel of transistor 228a. Transistor 229a operates in a similar manner with electrode 222a forming a Schottky barrier diode at the opening 248 which when reverse biased acts as a drain of transistor 229a. The source of transistor 229a is the impurity region 243. The body of transistor 229a is at the potential of the source minus a diode drop voltage of approximately 0.6 volts.

In FIGS. 20 through 23 electrodes 221a and 222a have a width of approximately 4 micrometers and a spacing of approximately 4 micrometers. Semiconductor strips 223a and 224a have a width of approximately 4 micrometers and a spacing of 4 micrometers.

Figure 24:
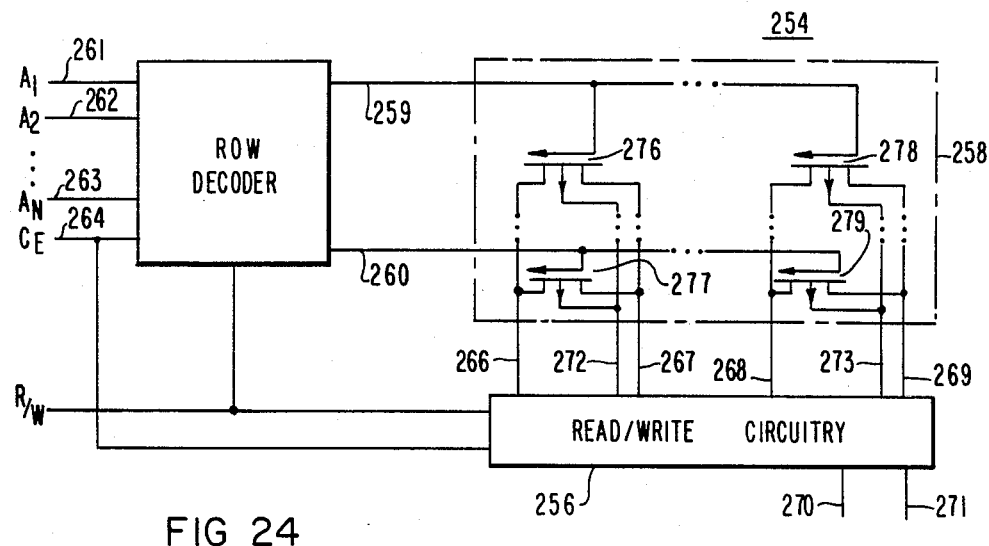
FIG. 24 is a circuit schematic of a memory containing an array of variable threshold transistors.

FIG. 24 is a circuit schematic of a memory containing an array of variable threshold transistors. In FIG. 24, memory 254 comprises row decoder 255, read/write circuitry 256 and memory array 258. Row decoder 255 functions to select one of the output lines 259 or 260 in response to address signals on lines 261 through 263. In addition a chip enable signal is coupled over line 264 to an input of row decoder 255 and also an input of read/write circuitry 256. A read/write control signal is coupled over line 265 to an input of row decoder 255 and read/write circuitry 256. Read/write circuitry 256 functions to sense the output signals by applying proper voltages to the column lines 266 through 269, 272 and 273 during read operation and to apply appropriate voltages to the column lines 266 through 269, 272 and 273 and row lines 259 and 260 during write operation. Data to be read in or read out of memory array 258 is coupled through data lines 270 and 271 of read/write circuitry 256. Memory array 256 comprises variable threshold transistors 276 through 279 which may be, for example, metal nitride oxide semiconductor (MNOS) transistors. Line 259 is coupled to the gate of transistors 276 and 278. Line 260 is coupled to the gate of transistors 277 and 279. Line 266 is coupled to the drain of transistors 276 and 277. Line 268 is coupled to the drain of transistors 278 and 279. Line 267 is coupled to the source of transistors 276 and 277. Line 269 is coupled to the source of transistors 278 and 279. Line 272 is coupled to the body of transistors 276 and 277. Line 273 is coupled to the body of transistors 278 and 279. The body of transistors 276 through 279 may each be coupled to a separate line or isolated by using separate islands for each transistor. Memory array 258 may be expanded having N rows and M columns. Row decoder 255 and read/write circuitry 256 may be expanded to accommodate a larger memory array 256 comprised of N rows and M columns, for example 512 words (rows) by 512 bits (columns).

A more detailed description of an embodiment of row decoder 255, read/write circuitry 256 and interconnection to memory array 258 for a random access memory is described in U.S. Pat. No. 4,124,900 which issued on Nov. 7, 1978 to Philip C. Smith, the inventor herein, and John L. Fagan, which is incorporated herein by reference. Another detailed description of an embodiment of row decoder 255, read/write circuitry 256 and interconnection to memory array 258 for an MNOS/SOS random access memory is described in U.S. Pat. No. 3,836,894 which issued on Sept. 17, 1974 to James R. Cricchi and which is incorporated herein by reference.

Figure 25:
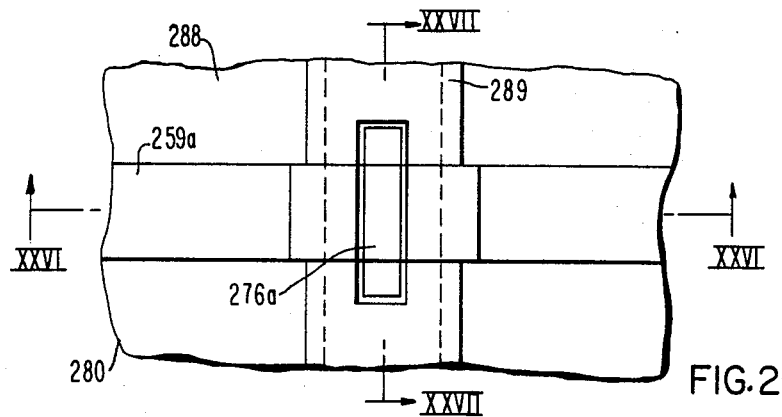
FIG. 25 is a plan view of an alternate embodiment of the invention implementing the memory array of FIG. 24.
Figure 26:
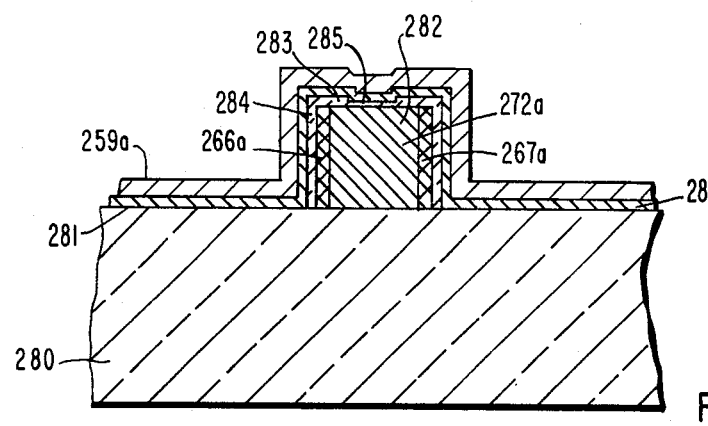
FIG. 26 is a cross-section view along the lines XXVI—XXVI of FIG. 25.
Figure 27:
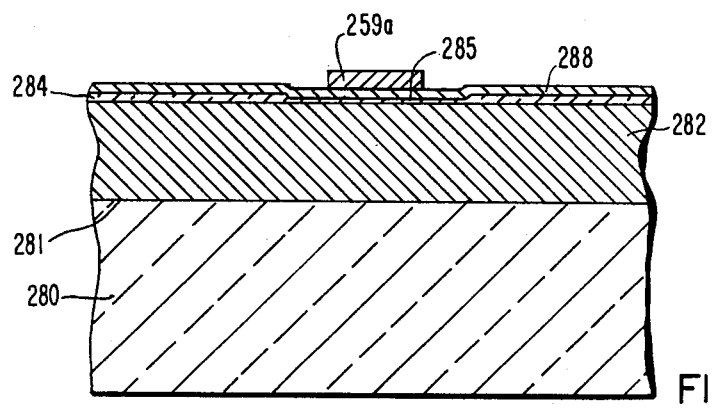
FIG. 27 is a cross-section view along the lines XXVII—XXVII of FIG. 25.

FIG. 25 is a plan view of a variable threshold transistor 276a suitable for use in memory array 258. FIGS. 26 and 27 show cross-section views of FIG. 25. In FIG. 25, insulating substrate 280 has an upper surface 281 which has a silicon bar or silicon strip 282 deposited thereon. Silicon bar 282 may, for example, have a height of 0.6 micrometers and a width of 4 micrometers. Silicon bar 282 has a thermal oxide layer 284 on its upper surface and on its side edges as shown in FIG. 26. A portion of the thermal oxide 284 which is generally of a thickness of 600 angstroms is thin in region 285 to approximately 20 angstroms thick to provide a memory characteristic or charge trapping in the variable threshold transistor structure. A layer of silicon nitride 288 is deposited over upper surface 281 of insulating substrate 280 and about the sides and upper surface of insulating layer 284 which may, for example, be 500 angstroms thick. A gate electrode is formed by depositing an electrode 259a over silicon nitride layer 288 and thermal oxide 284 across the upper surface 283 of silicon bar 282. Electrode 259a may, for example, be 4 micrometers wide and comprised of aluminum or polysilicon. As shown in FIG. 25 region 285 extends beyond electrode 259a on both sides and is interior of the side edges of silicon bar 282. Silicon bar 282 may, for example, be of n-type material and two edge diffusions of p-type impurities may be diffused in a silicon bar 282 to form the drain and source of transistor 276a and at the same time form lines 266a and 267a. The edge diffusions may, for example, penetrate into semiconductor bar 282 0.7 micrometers from each edge.

Figure 8:
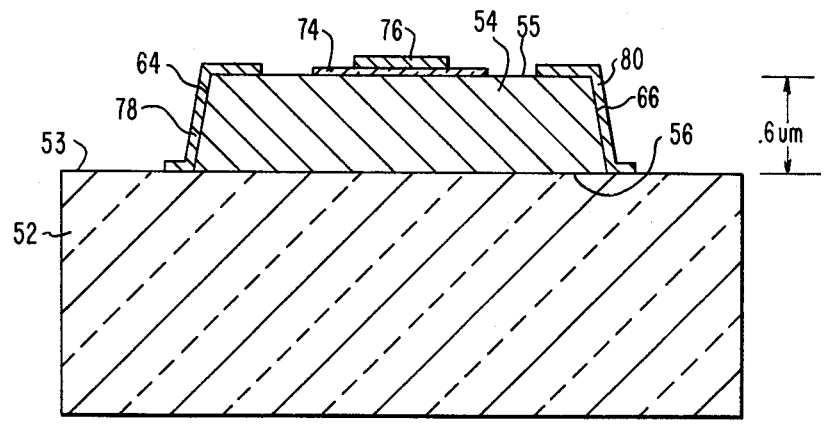
FIG. 8 is a cross-section view along the lines VIII—VIII of FIG. 7.
Figure 9:
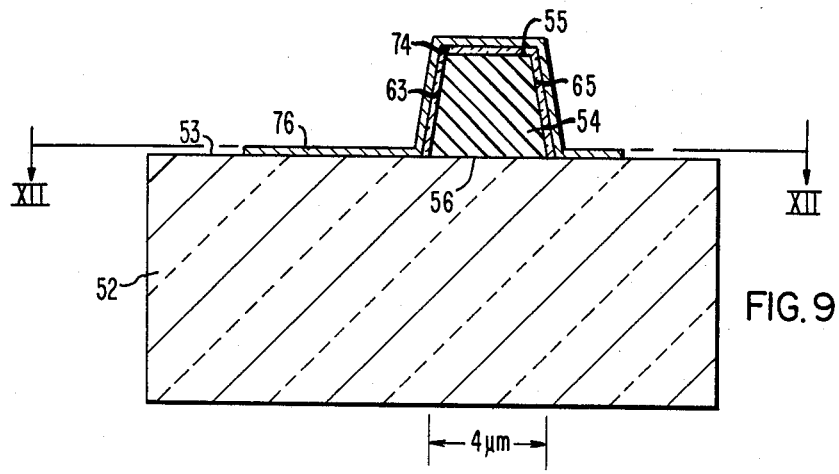
FIG. 9 is a cross-section view along the lines IX—IX of FIG. 7.
Figure 10:
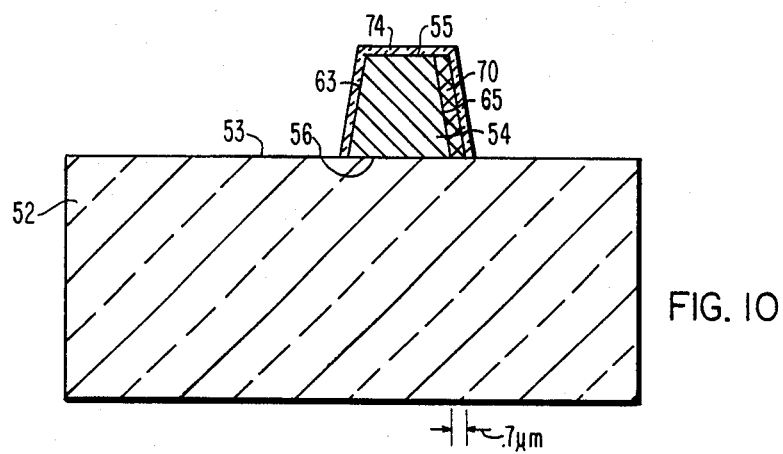
FIG. 10 is a cross-section view along the lines X—X of FIG. 7.
Figure 11:
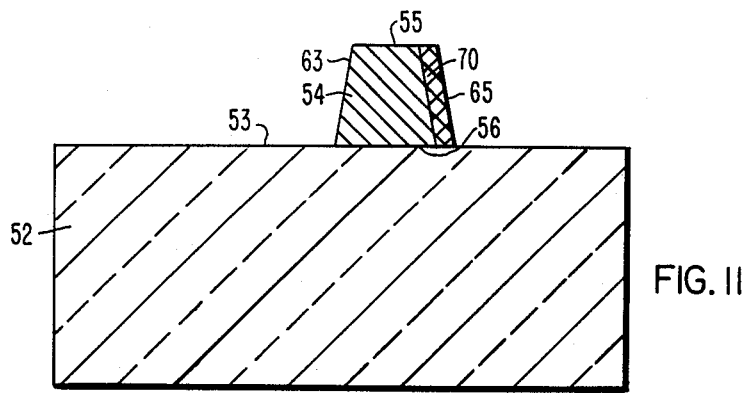
FIG. 11 is a cross-section view along the lines XI—XI of FIG. 7.
Figure 28:
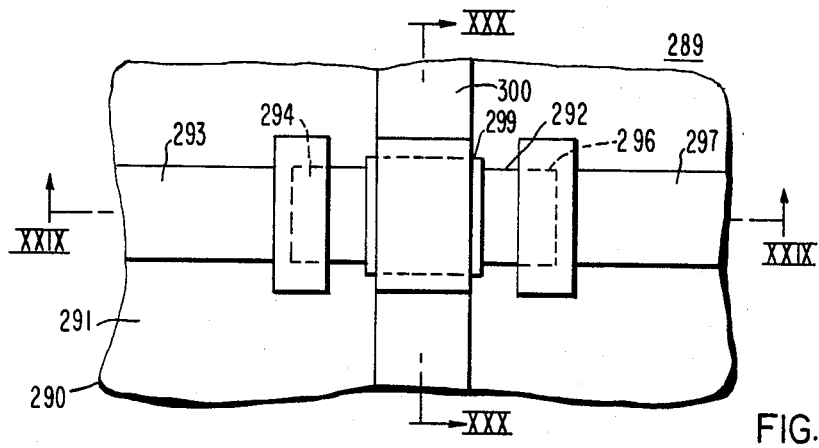
FIG. 28 is a plan view of an alternate embodiment of the invention implementing a cross-under.
Figure 29:
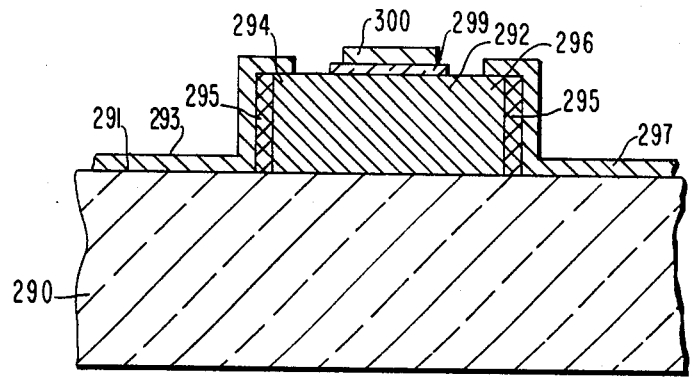
FIG. 29 is a cross-section view along the lines XXIV—XXIV of FIG. 28.
Figure 30:
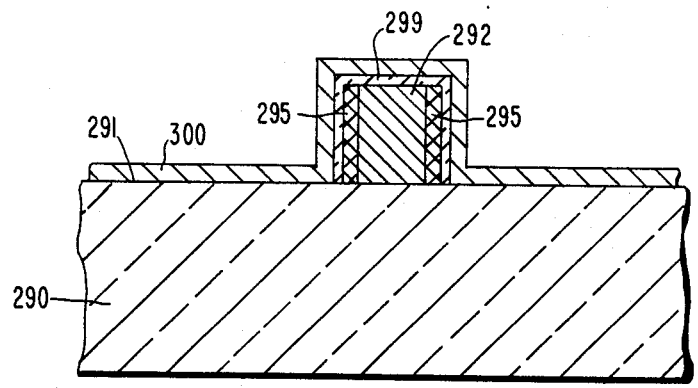
FIG. 30 is a cross-section view along the lines XXX—XXX of FIG. 28.

FIG. 28 is a plan view of an alternate embodiment of the invention implementing cross under 289. FIGS. 29 and 30 show cross-section views of FIG. 28. In FIG. 8, insulating substrate 290 has an upper surface 291 having a semiconductor bar 292 deposited thereon. Semiconductor bar 292 may, for example, be silicon having an upper surface in the <100> plane and side edges in the <111> plane in the shape of a rectangle having a width of 4 micrometers and a length of 16 micrometers and a depth of 0.6 micrometers. The edges of silicon bar 292 are used to drive in impurities which may, for example, be p or n-type around the perimeter of silicon bar 292 and penetrating to a depth of 0.7 micrometers from the edge. Electrode 293 is deposited on upper surface 291 and on semiconductor bar 292 at end 294 which may, for example, overlap silicon bar 292 by 2 micrometers. Electrode 293 may, for example, be aluminum or polysilicon and have a width of 4 micrometers expanding to 8 micrometers in the region of end 294. Electrode 293 makes an ohmic contact with edge diffusion 295. End 296 is opposite end 294 and is covered with electrode 297 which is deposited on upper surface 291 and overlaps end 298 by 2 micrometers. As shown in FIG. 28, electrode 297 may, for example, be 4 micrometers wide expanding to 8 micrometers in region of end 296. An insulation layer 299 which may, for example, be thermal oxide is shown deposited over semiconductor bar 292 in a region intermediate or interior of ends 294 and 296. Electrode 300 is deposited on upper surface 291 and over insulation layer 299 to the upper surface 291 on the other side of silicon bar 292. Electrode 300 may, for example, be aluminum or polysilicon. Insulation layer 299 functions to insulate electrode 300 from silicon bar 292. Electrode 293 has a conductive path through silicon bar 292 and electrode 297. Electrode 300 crosses semiconductor bar 292 transverse to the length of semiconductor bar 292 and is insulated therefrom. The embodiment of FIG. 28 is useful for providing conductive paths transverse to and insulated from one another on upper surface 291 of insulating substrate 290.

Figure 31:
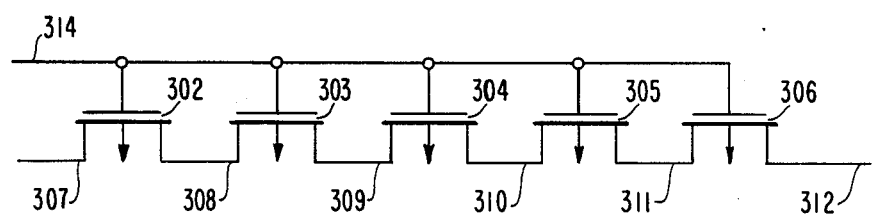
FIG. 31 is a circuit schematic of a semiconductor switch.

FIG. 31 is a circuit schematic of a semiconductor transistor 301. FIG. 31 shows transistors 302 through 306 coupled in series by their drain and source terminals by lines 307 through 312. The gate of transistors 302 through 306 are coupled in common to line 314.

Figure 32:
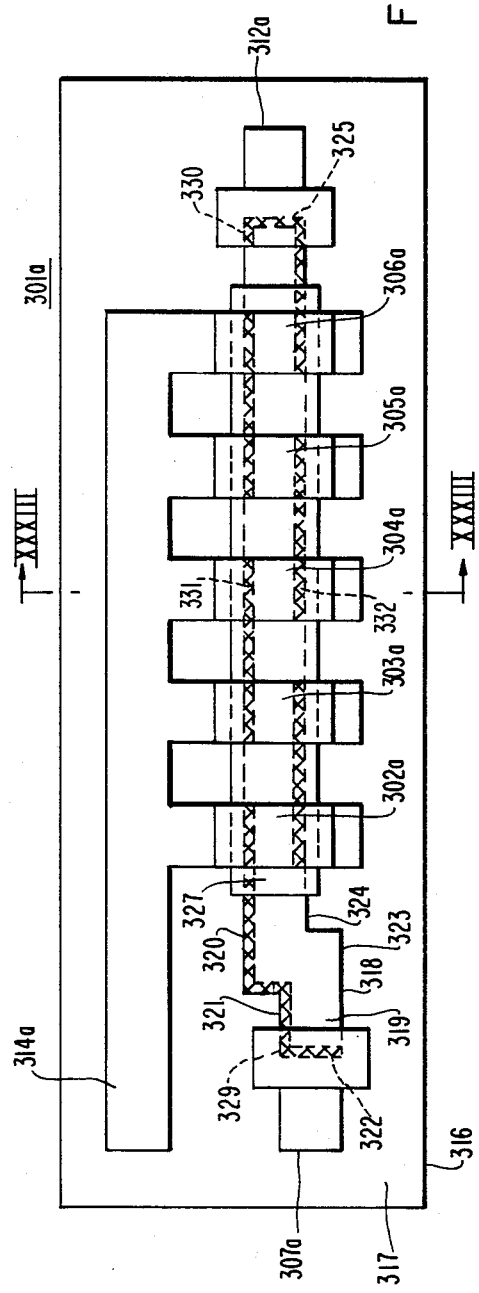
FIG. 32 is a plan view of an alternate embodiment of the invention implementing the semiconductor switch of FIG. 31.
Figure 33:
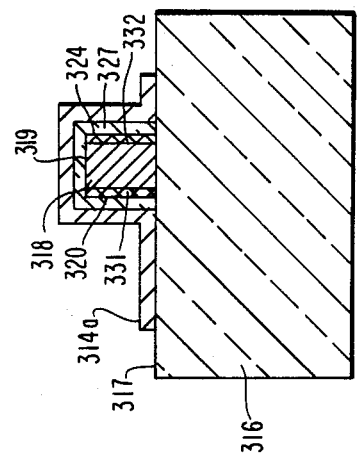
FIG. 33 is a cross-section view along the lines XXXIII—XXXIII of FIG. 32.

FIG. 32 is a plan view of an alternate embodiment of the invention implementing semiconductor transistor 301. FIG. 33 is a cross-section view along the lines XXXIII—XXXIII of FIG. 32. In FIg. 32, insulating substrate 316 has an upper surface 317. A semiconductor layer 318 shaped in the form of a silicon strip or bar is deposited over upper surface 317 of insulating substrate 316. Semiconductor layer 318 may, for example, be doped with impurities to form n-type material. Semiconductor layer 318 has an upper surface 319. P-type impurities are diffused into selected areas along edges 320 through 325 which extend from upper surface 317 of insulating substrate 316 to upper surface 319 of semiconductor layer 318. The p-type impurities which were diffused or implanted are diffused about 0.7 micrometers into semiconductor layer 318 from its respective edge in selected areas. The impurity regions provide the drain and source of transistors 302a through 306a and conductive paths therebetween coupling the transistors in series. An insulation layer 27 which may, for example, be thermal oxide is deposited over selected areas of upper surface 319 and edges 320 and 324. Insulation layer 327 functions as the gate dielectric for transistors 302a through 306a and to insulate the gate electrode from edges 320 and 324 of semiconductor layer 318. Electrode 314a extends over semiconductor layer 318 and insulation layer 327 at five spaced-apart regions to form transistors 302a through 306a. Electrode 307a is shown overlapping the end 329 of semiconductor layer 318 by about 2 micrometers. Electrode 312a is shown overlapping the end 330 of semiconductor layer 318 by about 2 micrometers. Insulating substrate 316 may, for example, be sapphire, aluminum oxide or spinel. Semiconductor layer 318 may be silicon. Electrodes 307a, 312a and 314a may, for example, be aluminum. The line widths and line spacings of metallization and semiconductor layer 318 may, for example, be 4 micrometers.

Transistor 304a has an impurity region 331 on edge 320 which extends along the edge to transistor 303a. Transistor 304a has impurity region 332 which extends along edge 324 to transistor 305a.

The transistor structure 301a shown in FIG. 32 has been fabricated and tested showing that MOS transistors within such as 304a with a 3- or 4-micrometer drain-to-source spacing and a 4-micrometer spacing from one another along a bar of semiconductor strip results in 20 volts voltage appearing across each transistor for a total of 100 volts from electrode 307a to electrode 312a. Depending upon the drain-to-source spacing it is possible to get 40 volts per transistor to provide a 200 volt switch utilizing five internal transistors coupled in series on a silicon bar. As shown in FIG. 32, the transistors were all p channel. An n channel drain and source may be used by diffusing phosphorus or arsenic impurities into the edges of semiconductor layer 318. The semiconductor layer 318 would be doped with impurities such as boron to form a p-type layer. Since aluminum will not form a Schottky barrier diode with a p-type semiconductor layer, ends 329 and 330 may be doped on upper surface 319 with impurities to form n-type material so that electrodes 307a and 312a are in contact with n-type material only. N-type doping may be accomplished by ion implantation of phosphorus or by thermal diffusion. Ion implantation is self-aligned because the mask used to etch the contact hole through the silicon dioxide may also be used to prevent implantation in areas other than the contact. In addition, semiconductor layer 318 should have additional doping close to upper surface 317 in semiconductor layer 318 to prevent a back channel from forming on the underneath side of 318. A ion implantation of boron close to the lower surface of semiconductor layer 318 will prevent the formation of a back channel where the semiconductor layer is p-type and the drain and source regions are n-type to form an n-type transistor on the upper surface 319. This additional doping applies to all n channel transistors.

Metallization interconnects on the upper surface on the thermal oxide over the silicon may cause inversions in the silicon causing conductive channels at times the voltage of the conductor exceeds $V_T$. The channel may couple impurity regions together not intended resulting in unwanted MOS transistors being formed, known as parasitic transistors. If the channel extends from only one impurity region, no current will flow and the unwanted channel will be harmless.

Aluminum metallization contacts to N type silicon will form a Schottky barrier diode if the doping is low such as 20 ohm centimeters. An ohmic contact may be made by aluminum if the silicon is doped by an N+ diffusion or ion implantation. Silicon doped to 1 ohm centimeter causes Schottky barrier diode to fail and an ohmic contact is made.

Figure 34:
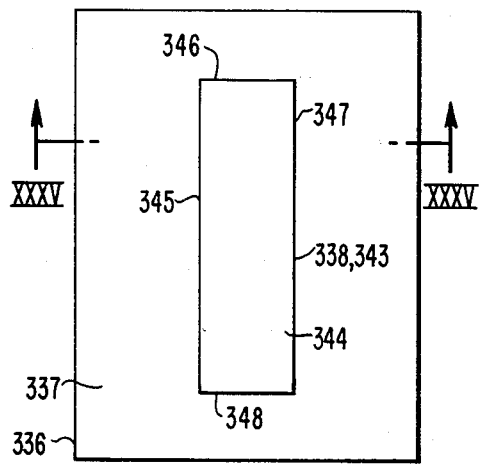
FIG. 34 is a plan view of a semiconductor island.
Figure 35:
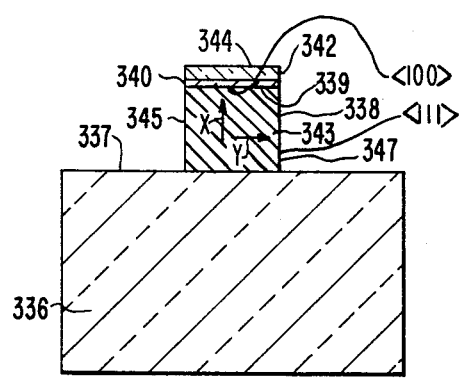
FIG. 35 is a cross-section view along the lines XXXV—XXXV of FIG. 34.

A process for fabricating an edge-diffused semiconductor device will be more easily understood by referring to FIG. 34 which is a plan view of a semiconductor island. FIG. 35 is a cross-section view along the lines XXXV—XXXV of FIG. 34. Insulating substrate 336 has an upper surface 337. A semiconductor layer 338 was deposited over insulating substrate 336 which should be mono-crystalline to form good devices. A layer of thermal oxide was formed on the upper surface 339 of semiconductor layer 338 which may, for example, be 400 angstroms thick. A layer of silicon nitride 342 is deposited over silicon dioxide layer 340 and may, for example, be 2000 angstroms thick. A semiconductor island 343 is formed by applying a photo-resist mask to the silicon nitride and etching the silicon nitride with phosphoric acid. Utilizing the photo-resist mask and silicon nitride as a mask the exposed silicon dioxide may be etched with a buffered hydrofloric acid or by plasma etching. Utilizing the photo-resist, silicon nitride and silicon dioxide as a mask over semiconductor layer 338, the semiconductor layer is etched down to the upper surface 337 of insulating substrate 336. If semiconductor layer 338 is silicon, the silicon may be etched with sodium hydroxide or by Hydrazine which is well known in the art. Edges 345 through 348 of island 343 may, for example, be in the <111> crystalline plane if the semiconductor layer is silicon. The upper surface 339 is in the <100> crystalline plane if island 343 is silicon. As shown in FIG. 34 island 343 is rectangular in shape and may, for example, have a depth of 0.6 micrometers, a width of 4 micrometers and a length as long as desired. Other geometric shapes other than rectangles may be formed from semiconductor layer 338 such as shown in FIGS. 14 and 16.

Figure 36:
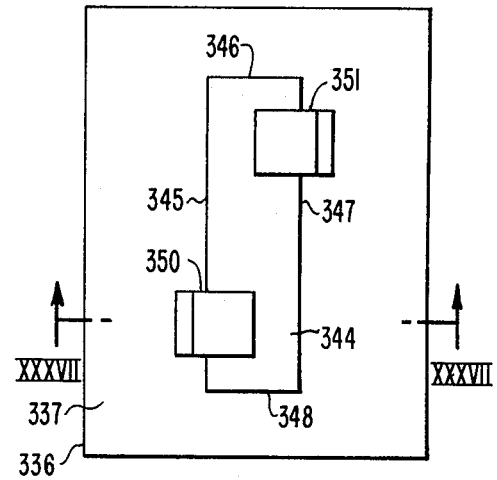
FIG. 36 is a plan view of a semiconductor island with portions masked.

FIG. 36 is a plan view of a semiconductor island with selected areas of edges or sidewalls masked.

Figure 37:
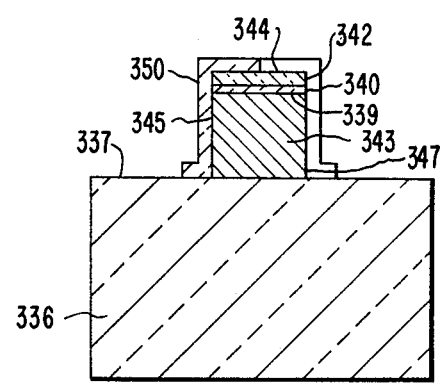
FIG. 37 is a cross-section view along the lines XXXVII—XXXVII of FIG. 36.

FIG. 37 is a cross-section view along the lines XXXVII—XXXVII of FIG. 36. In FIG. 36 like references are used for the same structure and function as shown in FIG. 34. In order to protect select areas of edges 345 and 347 from a subsequent diffusion or ion implantation a layer of silicon dioxide or silox is deposited over upper surface 337 of insulating substrate 336 and edges 345 through 348 and upper surface 339 of semiconductor island 343. The deposited silicon dioxide may, for example, be 3000 angstroms thick. Utilizing photoresist the silicon dioxide may be etched to form desired patterns utilizing hydrofloric acid. In FIG. 36, silicon dioxide pattern 350 is shown covering a selected length of edge 345 extending from the lower to upper surface of island 343. Silicon dioxide pattern 350 also extends onto upper surface 337 and upper surface 344 of silicon nitride 342. Silicon dioxide pattern 351 is shown covering a selected length of edge 347 overlying a portion of upper surface 344 of silicon nitride 342 and upper surface 337 of insulating substrate 336. At this stage in the process two masks have been used. The first mask was used to determine the semiconductor islands and their shape and the second mask was used to determine edge segments to be protected by a layer of silicon dioxide.

Semiconductor island 343 is now ready for diffusing impurities into the edge to a depth in the range of from 0.6 to 0.8 micrometers. Following diffusion of the impurities which may be n- or p-type into the edge where exposed, the silicon dioxide 350 and 351, silicon nitride 342 and silicon dioxide or thermal oxide 340 is removed by etching. New thermal oxide is grown over the exposed silicon island 343. The new thermal oxide may, for example, be 800 angstroms thick.

Figure 38:
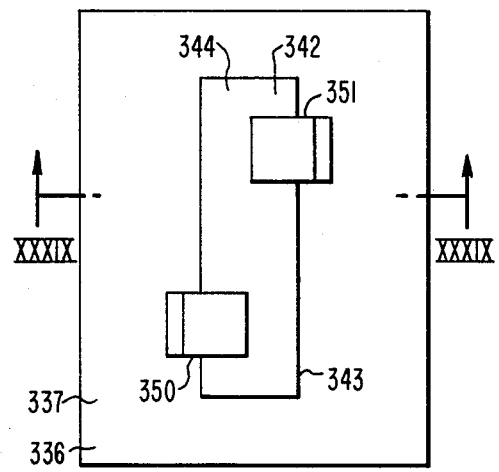
FIG. 38 is a plan view of a semiconductor island after doping selected edge areas with impurities.

FIG. 38 is a plan view of a semiconductor island after doping selected edge areas with impurities.

Figure 40:
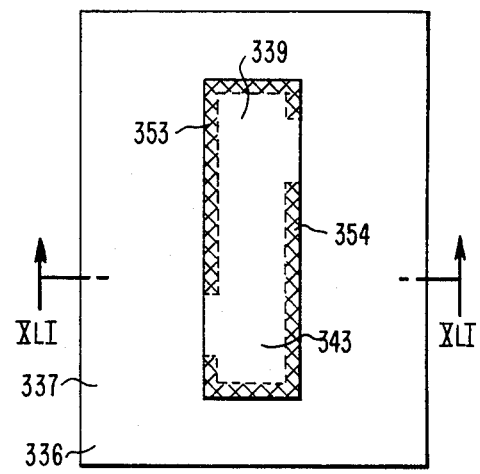
FIG. 40 is a plan view of a semiconductor island with the mask removed.
Figure 39:
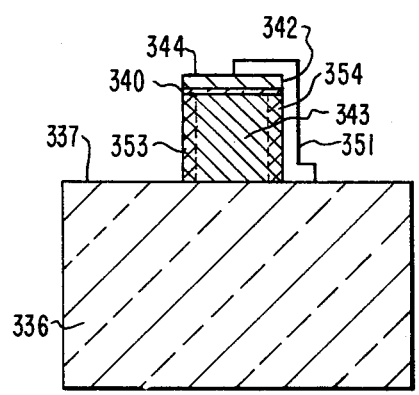
FIG. 39 is a cross-section view along the lines XXXIX—XXXIX of FIG. 38.
Figure 41:
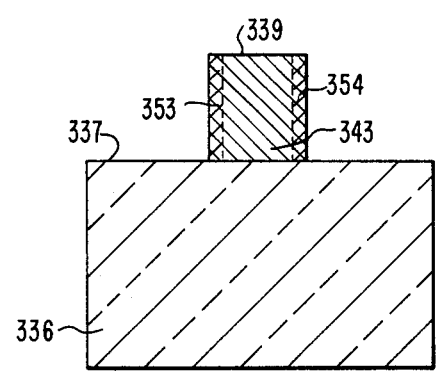
FIG. 41 is a cross-section view along the lines XXXI—XXXI of FIG. 40.

FIG. 39 shows a cross-section view of FIG. 38. FIG. 40 is a plan view of a semiconductor island with the edge mask of silicon dioxide 350 and 351 and silicon nitride 342 and silicon dioxide 340 layers removed. The pattern of impurities diffused into the edge is clearly shown in FIG. 40. It is understood that the silicon nitride layer 342 and silicon dioxide layer 340 on upper surface 339 prevents any impurities from diffusing into upper surface 339 of semiconductor layer 338. Impurity regions 353 and 354 are shown in FIG. 40.

The implementation of high-density integrated circuits utilizing the invention described herein may best be achieved using photolithic techniques to achieve minimum geometry, minimum spacing and minimum alignment tolerance. For example, utilizing a Model 3600 Step and Repeat Imaging System manufactured by the David Mann Division of GCA, Inc. located in Burlington, MA, two-micrometer minimum line widths and line spacings may be achieved with an alignment tolerance of 0.5 micrometers. The foregoing resolution is in contrast to the state of the art in 1977 with 4-micrometer minimum resolution and spacing was achievable with $\pm 1$ micrometer alignment tolerance. In the laboratory in 1980 resolutions such as 1.25 micrometer line widths and spacings of aluminum and polysilicon and single crystal silicon can be achieved with an alignment tolerance of 0.3 micrometers. It is desirable with the present state of the art to utilize a direct step and repeat photomask system which is considered superior to the old contact mask procedures. In a typical step and repeat system a 10X image is projected through a reducing lens to give a 1X image on the wafer. The 1X image would represent a single integrated circuit. A wafer is typically placed on a table which can be positioned within 0.04 microns and is indexed in increments in the X and Y direction to fully expose the wafer with an array of integrated circuits. The structures shown in the drawing may utilize the minimum dimensions the photolithic techniques allow.

Figure 42:
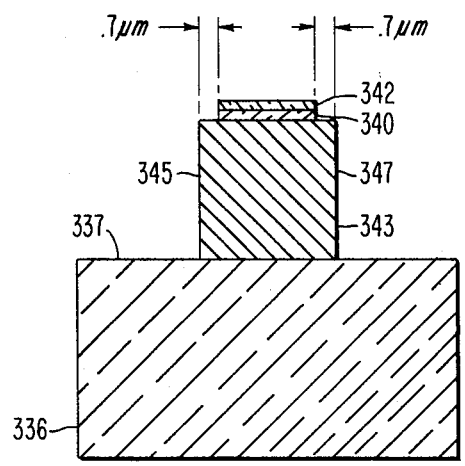
FIG. 42 is a cross-section view of a semiconductor island after etching the edges of the mask.
Figure 43:
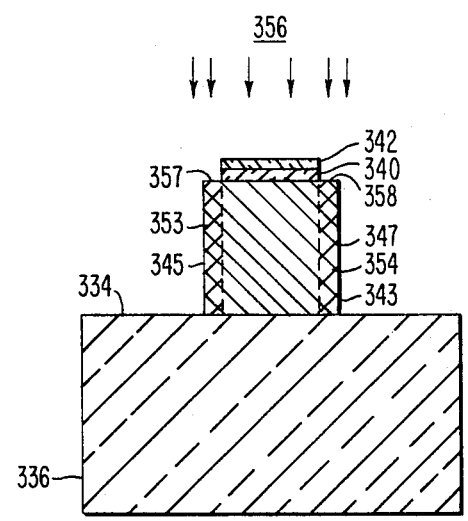
FIG. 43 is a cross-section view of a semiconductor island during the step of ion implanting impurities into the island edges.

Another method of introducing impurities into the edge of a semiconductor island at desired locations is shown in FIGS. 42 and 43. Like references are used for the same structure and function shown in FIG. 34. In FIG. 42 silicon nitride layer 342 and silicon dioxide layer 340 are etched around the edge to expose the upper surface interior of the silicon island perimeter by about 0.7 micrometers. FIG. 43 shows ions bombarding semiconductor island 343 through the mask formed by silicon nitride layer 342 and silicon dioxide layer 340. Ions 356 represented by arrows are deflected by upper surface 342 but penetrate island 343 where upper surface 339 is exposed above sides 345 and 347 shown by portions 357 and 358. Ions 356 therefore form impurity regions 353 and 354 according to the pattern, for example, shown in FIG. 40. By selectively etching the edge of the mask on upper surface 339 very narrow impurity regions may be formed along edges 345 and 347. For example, 1000 angstroms may be removed to expose a depth of 1000 angstroms at surface portions 357 and 358 permitting an impurity region to be formed by ion implantation which would penetrate 1000 angstroms interior of the edges 345 and 347. The mask formed by layers 340 and 342 would permit a self-aligned structure or gate to be used with respect to the drain and source of the semiconductor device fabricated.

With the impurities formed along the edges and appropriate gaps in the impurity concentration formed, the silicon nitride and silicon dioxide used to mask the impurity may be stripped off and 800 angstroms of thermal oxide grown over the edges and upper surface as previously described. Photo-resist may be used with a third mask to define windows through the thermal oxide for subsequent contact by aluminum or polysilicon. Following deposition of a layer of aluminum or polysilicon a fourth mask is used to define interconnections. It is to be noted that the aluminum may not cover all the exposed silicon areas. To protect exposed silicon areas and the polysilicon or metallization a passivation layer may be deposited over everything and a fifth mask may be used to expose areas through the passivation layer for contact above the passivation layer.

What is claimed is:

1. A semiconductor device comprising:
   an insulating substrate,
   a semiconductor layer having an upper and lower surface positioned on said insulating substrate and having a predetermined thickness,
   first and second spaced-apart edges formed by sidewall surfaces extending between said upper and lower surface of said semiconductor layer,
   said semiconductor layer doped with impurities to exhibit a first type material,
   said first and second edges doped with impurities of a second type introduced through said sidewall surfaces to a predetermined depth from said respective edge to form first and second regions of a second type,
   a layer of insulation positioned over said upper surface of said semiconductor layer extending between said first and second regions,
   a layer of conductive material positioned over said insulation layer and extending between said first and second regions,
   first means for making ohmic contact to said first region including aluminum deposited on said first region and extending over onto said upper surface of said semiconductor layer, and
   second means for making ohmic contact to said second region.

2. The semiconductor device of claim 1 wherein said semiconductor layer is n type and said aluminum in contact with said semiconductor layer forms a Schottky barrier dode.

3. A semiconductor device comprising:
   an insulating substrate,
   a semiconductor layer having an upper and lower surface positioned on said insulating substrate and having a predetermined thickness,
   said semiconductor layer having sidewall surfaces extending between said upper and lower surface of said semiconductor layer,
   said semiconductor layer doped with impurities to exhibit a first type material,
   said sidewall doped with impurities of a second type to a predetermined depth from said sidewall in at least two selected areas spaced apart along a common sidewall to form first and second spaced apart regions of a second type separated by a sidewall region of said first type,
   a layer of insulation positioned over said side wall of said semiconductor layer and extending between said first and second regions,
   a layer of conductive material positioned over said insulation layer and extending between said first and second regions, and
   means for making ohmic contact to said first and second regions.

4. A read only memory array comprising:
   an insulating substrate having an upper surface,
   a plurality of spaced apart semiconductor strips having an upper and lower surface and positioned on said upper surface of said substrate,
   each said strip having a first and second edge on either side of said strip extending from said lower surface to said upper surface,
   said semiconductor strips doped with impurities to exhibit material of a first type,
   said first edge of each strip doped with impurities of a second type formed by introducing selected impurities through said first edge to form a first region of a second type extending from said first edge into said semiconductor strip to a depth in the range from 0.1 to 1 micrometer,
   each said strip having an insulation layer over its upper surface and first and second edges except at predetermined upper surface locations,
   a plurality of spaced apart aluminum metallization strips extending over and transverse to said plurality of semiconductor strips including said first region and contacting said semiconductor strip at said predetermined upper surface locations.

5. A semiconductor device comprising:
   an insulating substrate,
   a semiconductor layer having an upper and lower surface positioned on said insulating substrate,
   first and second spaced-apart sidewall surfaces extending between said upper and lower surface of said semiconductor layer,
   said semiconductor layer doped with impurities to exhibit a first type material,
   said semiconductor layer including first and second spaced apart regions of a second type formed by introducing selected impurities through selected areas of said first and second sidewall surfaces respectively,
   a layer of insulation positioned over said upper surface of said semiconductor layer extending between said first and second regions,
   a layer of conductive material positioned over said insulation layer and extending between said first and second regions,
   said semiconductor layer being rectangular in shape and said first region extending beyond a first side of said layer of conductive material along a sidewall to a first corner of said rectangular semiconductor layer, and
   aluminum deposited over exposed portions of said first region and over exposed portions of said semiconductor layer.

6. The semiconductor device of claim 5 wherein said semiconductor layer is n type and said aluminum over exposed portions of said semiconductor layer forms a Schottky barrier diode.

7. A semiconductor device comprising:
   an insulating substrate,
   a semiconductor layer having an upper and lower surface positioned on said insulating substrate,
   first and second spaced-apart sidewall surfaces extending between said upper and lower surface of said semiconductor layer,
   said semiconductor layer doped with impurities to exhibit a first type material, said semiconductor layer including first and second spaced apart regions of a second type formed by introducing selected impurities through selected areas of said first and second sidewall surfaces respectively, a layer of insulation positioned over said upper surface of said semiconductor layer extending between said first and second regions, a layer of conductive material positioned over said insulation layer and extending between said first and second regions, and first means for making ohmic contact to said first region including aluminum deposited on said first region and extending over onto said semiconductor layer.

8. The semiconductor device of claim 7 wherein said semiconductor layer is n type and said aluminum in contact with said semiconductor layer forms a Schottky barrier diode.

9. A semiconductor device comprising:

an insulating substrate, a semiconductor layer having an upper and lower surface positioned on said insulating substrate and having a first sidewall surface extending between said upper and lower surface, said semiconductor layer doped with impurities to exhibit a first type material, said first sidewall including first and second spaced apart regions of a second type, a layer of insulation positioned over said first side wall of said semiconductor layer and extending between said first and second regions, a layer of conductive material positioned over said insulation layer and extending between said first and second regions, and first means for making ohmic contact to said first region including aluminum deposited over said first region and over said semiconductor layer, and wherein said semiconductor layer is n type and said aluminum over said semiconductor layer forms a Schottky barrier diode.

10. The semiconductor device of claim 9 wherein said first region extends from said first sidewall surface to a predetermined distance into said semiconductor layer.

11. The semiconductor device of claim 10 wherein said predetermined distance from said first sidewall surface is in the range from 0.5 to 1 micrometer.

12. The semiconductor device of claim 10 wherein said predetermined distance from said first sidewall surface is in the range from 1000 to 3000 angstroms.

13. The semiconductor device of claim 9 wherein said first and second spaced apart regions are formed at times said upper surface of said semiconductor layer if protected by a layer of material impervious to said selected impurities.

14. The semiconductor device of claim 13 wherein said layer of material includes thermal oxide.

15. A semiconductor circuit comprising:

an insulating substrate having an upper surface, a semiconductor island having an upper and lower surface and positioned on said upper surface of said substrate, said semiconductor island having an edge around said island extending from said lower surface to said upper surface, said semiconductor island doped with impurities to exhibit material of a first type, a first layer of dielectric material covering the upper surface of said semiconductor island, said edge doped to form at least first, second and third edge segments with impurities of a second type formed by introducing selected impurities through said edge, said first and second edge segments spaced apart along an edge by a first predetermined distance, a second layer of dielectric material covering the edge between said first and second segments, said second and third edge segments having portions spaced apart across said semiconductor island, a conductive electrode overlying a path over said first layer of dielectric material between said second and third edge segments and overlying a path over said second layer of dielectric material between said first and second edge segments to couple said first, second and third edge segments together at times a predetermined voltage is applied to said conductive electrode, means for making ohmic contact to said first edge segment including aluminum deposited over said first segment and over said semiconductor island, and wherein said semiconductor island is n type, and said aluminum over said semiconductor layer forms a Schottky barrier diode.

16. The semiconductor circuit of claim 15 further including means for making ohmic contact to at least two of said first, second and third edge segments.

17. A semiconductor circuit comprising:

an insulating substrate having an upper surface, a semiconductor island having an upper and lower surface and positioned on said upper surface of said substrate, said semiconductor island having an edge around said island extending from said lower surface to said upper surface, said semiconductor island doped with impurities to exhibit material of a first type, a first layer of dielectric material covering the upper surface of said semiconductor island, said edged doped to form at least first, second and third edge segments with impurities of a second type formed by introducing selected impurities through said edge, said first and second edge segments spaced apart along an edge by a first predetermined distance, a second layer of dielectric material covering the edge between said first and second edge segments, said second and third edge segments having portions spaced apart across said semiconductor island, a first conductive electrode overlying a path over said first layer of dielectric material between said second and third edge segments to couple said second and third edge segments together at times a first predetermined voltage is applied to said first conductive electrode, a second conductive electrode overlying a path over said second layer of dielectric material between said first and second edge segments to couple said first and second edge segments together at times a second predetermined voltage is applied to said second conductive electrode, means for making ohmic contact to said first edge segment including aluminum deposited over said first segment and over said semiconductor island, and wherein said semiconductor island is n type, and said aluminum over said semiconductor layer forms a Schottky barrier diode.

18. The semiconductor circuit of claim 17 further including means for making ohmic contact to at least two of said first, second and third segments.

19. The semiconductor circuit of claim 17 wherein said second conductive electrode is in ohmic contact with said first edge segment.

20. A row decoder circuit comprising:
an insulating substrate having an upper surface,
a plurality of spaced apart semiconductor strips having an upper and lower surface and positioned on said upper surface of said substrate,
each said strip having a first and second edge on either side of said strip extending from said lower surface to said upper surface,
said semiconductor strips doped with impurities to exhibit material of a first type,
said first and second edges of each strip doped at predetermined edge segments with impurities of a second type formed by introducing selected impurities through said first and second edges at said predetermined edge segments to form a plurality of spaced apart doped edge segments,
said doped edge segments extending 0.7 micrometers from said edge into said semiconductor strip,
said doped edge segments on said first and second edges having portions positioned opposite one another across a respective semiconductor strip,
each strip having an insulation layer over its upper surface and first and second edges,
a plurality of spaced apart conductive strips extending over and transverse to said plurality of semiconductor strips and over doped edge segments positioned opposite one another to form MOS transistors,
said MOS transistors and doped edge segments interconnected along one semiconductor strip to form a continuous conductive path at times said transistors in said semiconductor strip are conductive and non-conductive at times one or more of said MOS transistors are non-conductive.

21. The row decoder of claim 20 wherein said semiconductor strips are four micrometers wide.

22. The row decoder of claim 20 wherein said semiconductor strips are spaced four micrometers apart.

23. The row decoder of claim 20 wherein said material of a first type is n type.

24. The row decoder of claim 20 wherein said conductive strips are four micrometers wide.

25. The read only memory of claim 4 wherein said semiconductor strips are four micrometers wide.

26. The read only memory of claim 4 wherein said semiconductor strips are spaced four micrometers apart.

27. The read only memory of claim 4 wherein said material of a first type is n type.

28. The read only memory of claim 4 wherein said aluminum metallization strips are four micrometers wide.

29. A read only memory array comprising:
an insulating substrate having an upper surface,
a plurality of spaced apart semiconductor strips having an upper and lower surface and positioned on said upper surface of said substrate,
each said strip having a first and second edge on either side of said strip extending from said lower surface to said upper surface,
said semiconductor strips doped with impurities to exhibit material of a first type,
said first edge of each strip doped with impurities of a second type formed by introducing selected impurities through said first edge to form a first region of a second type extending 0.7 micrometers from said first edge into said semiconductor strip,
each said strip having an insulation layer over its upper surface and first and second edges except at predetermined upper surface locations,
a plurality of spaced apart aluminum metallization strips extending over and transverse to said plurality of semiconductor strips including said first region and contacting said semiconductor strip at said predetermined upper surface locations.

30. The read only memory of claim 4 wherein said first region of each semiconductor strip is coupled through a respective resistor to a first voltage potential.

31. The read only memory of claim 4 wherein said insulation layer extends a predetermined distance from said first region to said predetermined upper surface location, said upper surface location forms an opening in said insulation layer exposing said upper surface of said semiconductor strip.

32. A read only memory array comprising:
an insulating substrate having an upper surface,
a plurality of spaced apart semiconductor strips having an upper and lower surface and positioned on said upper surface of said substrate,
each said strip having a first and second edge on either side of said strip extending from said lower surface to said upper surface,
said semiconductor strips doped with impurities to exhibit material of a first type,
said first edge of each strip doped with impurities of a second type formed by introducing selected impurities through said first edge to form a first region of a second type,
each said strip having an insulation layer over its upper surface and first and second edges except at predetermined upper surface locations,
a plurality of spaced apart aluminum metallization strips extending over and transverse to said plurality of semiconductor strips including said first region and contacting said semiconductor strip at said predetermined upper surface locations,
said insulation layer extending a predetermined distance from said first region to said predetermined upper surface location, said upper surface location forms an opening in said insulation layer exposing said upper surface of said semiconductor strip, and
said aluminum metallization strip contacting each predetermined upper surface location forms the gate of a field effect transistor having a drain formed by the aluminum metallization strip in contact with said upper surface location and source formed by said first region.

33. The read only memory of claim 32 wherein said aluminum metallization strip in contact with said predetermined upper surface locations forms a Schottky barrier diode with said semiconductor strip.

34. The read only memory of claim 32 wherein said first type is N type, said first region of each semiconductor strip is coupled through a respective resistor to a first voltage potential and wherein said aluminum metallization strips are coupled to a row decoder, said row decoder responsive to address signals for selecting one of said metallization strips and coupling a second voltage potential which is negative with respect to said first voltage potential to said selected metallization strip.

35. The read only memory of claim 34 wherein said first voltage potential and the nonselected aluminum metallization strips are at ground potential.

36. The read only memory of claim 34 wherein said first region of each semiconductor strip is coupled to a respective output terminal.

37. A semiconductor device comprising:
an insulating substrate having an upper surface,
a semiconductor strip having an upper and lower surface and positioned on said upper surface of said substrate,
said strip having a first and second edge on either side of said strip extending from said lower surface to said upper surface,
said semiconductor strip doped with impurities to exhibit material of a first type,
said first and second edges of said strip doped at predetermined edge segments with impurities of a second type formed by introducing selected impurities through said first and second edges at said predetermined edge segments to form a plurality of spaced apart doped edge segments,
said doped edge segments extending from said respective edge into said semiconductor strip in the range from 0.1 to 1 micrometer,
said doped edge segments on said first and second edges having portions positioned opposite one another across said semiconductor strip,
said semiconductor strip having an insulation layer over said upper surface and first and second edges,
a plurality of spaced apart conductive strips extending over and transverse to said semiconductor strip and over doped edge segments positioned opposite one another to form a plurality of MOS transistors,
said plurality of conductive strips coupled together,
said plurality of MOS transistors and doped edge segments interconnected along said semiconductor strip to form a continuous conductive path at times said MOS transistors are conductive,
means for making ohmic contact to one of said doped edge segments including aluminum deposited over said doped edge segment and over said semiconductor strip, and wherein said semiconductor strip is n type, and said aluminum over said semiconductor strip forms a Schottky barrier diode.

38. The semiconductor device of claim 37 wherein said semiconductor strip is four micrometers wide.

39. The semiconductor device of claim 37 wherein said plurality of conductive strips are four micrometers wide spaced apart by four micrometers.

40. The semiconductor device of claim 37 wherein a first of said MOS transistors has a drain formed by a first one of said doped edge segments on said first edge and a source formed by a second one of said doped edge segments on said second edge and spaced apart in the range from three to four micrometers.

41. The semiconductor device of claim 40 wherein said drain formed by said first one of said doped edge segments on said first edge extends at least another eight micrometers along said first edge to form the source of said second one of said MOS transistors and a drain formed by a third one of said doped edge segments on said second edge spaced by at least four micrometers from said second doped edge segment.

42. The semiconductor circuit of claim 15 wherein said first edge segment extends from said edge to a distance from 0.1 to 1 micrometer.

43. The semiconductor circuit of claim 15 wherein said first edge segment extends from said edge to a distance from 1000 to 3000 angstroms.

44. The semiconductor circuit of claim 17 wherein said first segment extends from said edge to a distance from 0.1 to 1 micrometer.

45. The semiconductor circuit of claim 17 wherein said first edge segment extends from said edge to a distance from 1000 to 3000 angstroms.

46. A semiconductor device comprising:
an insulating substrate,
a semiconductor layer having an upper and lower surface positioned on said insulating substrate,
first and second spaced-apart sidewall surfaces extending between said upper and lower surface of said semiconductor layer,
said semiconductor layer doped with impurities to exhibit a first type material,
said semiconductor layer including first and second spaced apart regions of a second type formed by introducing selected impurities through selected areas of said first and second sidewall surfaces respectively,
said first region and second region extending from said respective sidewall surface to a depth in the range from 0.1 to 1 micrometer,
a layer of insulation positioned over said upper surface of said semiconductor layer extending between said first and second regions,
a layer of conductive material positioned over said insulation layer and extending between said first and second regions, and
first means for making ohmic contact to said first region including aluminum deposited on said first region and extending over onto said upper surface of said semiconductor layer, and second means for making ohmic contact to said second region.

47. The semiconductor device of claim 3 wherein said predetermined depth from said respective edge is in the range from 0.1 to 1 mircometer.

48. The semiconductor device of claim 9 wherein said predetermined distance from said first sidewall surface is in the range from 0.1 to 1 micrometer.

* * * * *